United States Patent
Felix

(10) Patent No.: US 10,820,409 B1
(45) Date of Patent: Oct. 27, 2020

(54) METHOD OF MANUFACTURING A COMPUTER DEVICE

(71) Applicant: Graphcore Limited, Bristol (GB)

(72) Inventor: Stephen Felix, Bristol (GB)

(73) Assignee: GRAPHCORE LIMITED, Bristol (GB)

(*) Notice: Subject to any disclaimer, the term of this patent is extended or adjusted under 35 U.S.C. 154(b) by 0 days.

(21) Appl. No.: 16/804,955

(22) Filed: Feb. 28, 2020

(30) Foreign Application Priority Data

Dec. 20, 2019 (GB) .................... 1919083.4

(51) Int. Cl.
*H05K 1/02* (2006.01)
*H05K 1/03* (2006.01)
*H05K 1/18* (2006.01)

(52) U.S. Cl.
CPC ......... *H05K 1/0231* (2013.01); *H05K 1/0215* (2013.01); *H05K 1/032* (2013.01); *H05K 1/184* (2013.01); *H05K 2201/0162* (2013.01)

(58) Field of Classification Search
CPC .. H05K 1/0231; H05K 1/0213; H05K 1/0215; H05K 1/032; H05K 2201/0162
See application file for complete search history.

(56) References Cited

U.S. PATENT DOCUMENTS

| | | | | |
|---|---|---|---|---|
| 5,786,979 A * | 7/1998 | Douglass | ................ | H01L 23/48 257/777 |
| 8,913,402 B1 * | 12/2014 | Berg | ..................... | H01L 23/481 361/804 |
| 9,640,531 B1 * | 5/2017 | Or-Bach | ........... | H01L 21/76816 |
| 2004/0238941 A1 * | 12/2004 | Satoh | ..................... | H05K 1/162 257/698 |
| 2007/0141800 A1 * | 6/2007 | Kurihara | ................. | H01L 24/16 438/396 |
| 2008/0284037 A1 | 11/2008 | Andry | | |
| 2010/0308435 A1 | 12/2010 | Nowak | | |
| 2015/0200242 A1 | 7/2015 | England | | |
| 2015/0264813 A1 * | 9/2015 | Zhou | ..................... | H01L 23/481 174/255 |
| 2019/0392992 A1 * | 12/2019 | Kumagae | .......... | H01L 23/49822 |

OTHER PUBLICATIONS

Combined Search and Examination Report dated Jul. 31, 2020 for Patent Application No. GB1919083.4. 12 pages.

* cited by examiner

Primary Examiner — Hoa C Nguyen

(74) Attorney, Agent, or Firm — Haynes and Boone, LLP

(57) ABSTRACT

According to a first aspect, there is provided a computer structure comprising a first silicon substrate and a second silicon substrate. Computer circuitry configured to perform computing operations is formed in the first silicon substrate, which has a self-supporting depth and an inner facing surface. A plurality of distributed capacitance units are formed in the second silicon substrate, which has an inner facing surface located in overlap with the inner facing surface of the first substrate and is connected to the first substrate via a set of connectors arranged extending depth-wise of the structure between the inner facing surfaces. The inner facing surfaces have matching planar surface dimensions. The second substrate has an outer facing surface on which are arranged a plurality of connector terminals for connecting the computer structure to a supply voltage. The second substrate has a smaller depth than the first substrate.

25 Claims, 18 Drawing Sheets

METHOD OF MANUFACTURING A COMPUTER DEVICE

CROSS-REFERENCE TO RELATED APPLICATIONS

The present application claims the priority benefit of United Kingdom Patent Application No. 1919083.4, filed on Dec. 20, 2019, which is incorporated by reference herein in its entirety.

TECHNICAL FIELD

The present disclosure relates to the control of variations in supply voltage to processing circuitry in a computer structure.

BACKGROUND

The problem relating to the control of voltage supplies for computer structures are known. In particular, large changes on current demand by on-chip processing circuitry causes undesirable artefact in the supply voltage. Changes in current demand are referred to as load steps.

One artefact is supply voltage droop, which occurs when the load admittance increases abruptly. This is a result of the series resistance and inductance of any circuitry existing between the power supply and the circuitry drawing the current. The resistance and inductance of these intervening elements may be referred to as parasitic resistance and inductance as they are not intended to be introduced into the circuit, but rather are unavoidable properties of circuit elements on a chip.

There are a number of ways of reducing the supply voltage droop. The intervening circuitry can be altered such that, for example, shorter or larger diameter wires are used to reduce the resistance of the wires. Lower impedance wires could also be used to reduce the supply droop voltage, as could the removal of connectors. These solutions, however, are not suitable for application in chips, where the dimensions of the circuitry are relatively fixed. Also, the currents required in comparison to the size of the circuitry means that such geometrical changes would have little effect on the supply voltage droop.

One known technique for limiting supply voltage droop is providing capacitances between the supply voltage and the circuit drawing the current.

There are a number of possible sources of capacitance which are currently available in a computer structure, some of which are discussed further in the following description, but none of these are sufficiently high to adequately address voltage droop in high current demand/low supply voltage structures.

SUMMARY

According to a first aspect, there is provided a computer structure comprising: a first silicon substrate in which is formed computer circuitry configured to perform computing operations, the first substrate having a self-supporting depth and an inner facing surface; a second silicon substrate in which is formed a plurality of distributed capacitance units, the second substrate having an inner facing surface located in overlap with the inner facing surface of the first substrate and connected to the first substrate via a set of connectors arranged extending depthwise of the structure between the inner facing surfaces, the inner facing surface of the second silicon substrate having planar surface dimensions matching the planar surface dimensions of the inner facing surface of the first silicon substrate; the second substrate having an outer facing surface on which are arranged a plurality of connector terminals for connecting the computer structure to a supply voltage, wherein the second substrate has a smaller depth than the first substrate.

The inner facing surfaces of the first and second substrate may be bonded by one or more bonding layer.

The connectors may comprise through silicon vias which extend through the second silicon substrate to the first silicon substrate to provide an electrical connection between the connector terminals and the first silicon substrate.

Each distributed capacitor unit may comprise a predefined number of capacitor blocks each having a capacitance in the range of 0.1 to 1.5 nF. The predefined number may be between 10 and 20.

Each distributed capacitance unit may have a capacitance in the range of 5 to 30 nF.

The total planar area of distributed capacitance units may be at least 80% of the total planar area of the first silicon substrate, the capacitance of the plurality of distributed capacitance units being in the range of 0.5 $\mu F/mm^2$ to 3 $\mu F/mm^2$.

The first silicon substrate may have a depth of 400 $\mu m$ to 1000 $\mu m$.

The second silicon substrate may have a non-self-supporting depth, the depth being less than 10 $\mu m$.

The distributed capacitor units may be arranged in a regular array, each distributed capacitor unit being connected to a supply voltage connector terminal and a ground connector terminal.

Each connector terminal may be connected to four different distributed capacitor terminals.

The set of connectors may provide connections between the first and second silicon substrates at the locations of the connector terminals.

Each distributed capacitance unit may comprise two keep-out regions, the keep-out regions being at the locations of respective connector terminals, the keep-out regions and capacitor blocks being of equal size.

Each capacitor block may comprise an array of trench capacitors arranged in a hexagonal array, wherein each trench capacitor has six neighbouring trench capacitors, each trench capacitor located equidistance from each of its neighbouring trench capacitors.

The through silicon vias may be provided at the keep-out regions of the distributed capacitor units.

The computer circuitry may comprise a plurality of processing units each having an execution unit and a local memory, the plurality of processing units configured to compute in parallel.

The computer circuitry may comprise synchronisation circuitry configured to control the plurality of processing units to operate according to a bulk synchronous parallel protocol.

The computer circuitry may comprise a clock connected to control operations of the processing units.

According to a second embodiment, there is provided a method of making a computer structure, the method comprising: providing a first silicon substrate comprising computer circuitry configured to perform computing operations, the first silicon substrate having a self-supporting depth; providing a second silicon substrate comprising a plurality of distributed capacitance units; bonding an inner facing surface of the first silicon substrate to an inner facing surface of the second silicon substrate such that the inner facing surfaces are located in overlap, the inner facing surfaces having matching planar surface dimensions, thinning the second silicon substrate such that the second substrate has a depth smaller than the first silicon substrate; and providing on an outer facing surface of the second substrate a plurality of connector terminals for connecting the computer structure to a supply voltage.

After thinning the second silicon substrate, through silicon vias may be formed in the second silicon substrate to provide connections between the connector terminals and the first silicon substrate.

The second silicon substrate may be thinned to a depth of less than 10 μm, such that the second silicon substrate has a non-self-supporting depth.

The first silicon substrate may have a depth of 700 μm to 800 μm.

The distributed capacitor units may be arranged in a regular array, each distributed capacitor unit may be connected to a supply voltage connector terminal and a ground connector terminal.

Each distributed capacitor unit may comprise a predefined number of capacitor blocks and two keep-out regions, the keep-out regions being at the locations of the two connector terminals, the keep-out regions and capacitor blocks being of equal size.

The through silicon vias may be formed at the location of the keep-out regions.

BRIEF DESCRIPTION OF THE DRAWINGS

For a better understanding of the embodiments and to show how the same may be carried into effect, reference will now be made by way of example to the following drawings.

DETAILED DESCRIPTION

Problems

A particular type of computer has been developed recently by Graphcore, referred to as an Intelligent Processing Unit (IPU) which is described for example un U.S. patent application Ser. No. 15/886,009.

Colossus is one such IPU chip manufactured by Graphcore. IPUs can be used in technical fields such as data analysis and artificial intelligence. The IPU has been optimised for massively parallel, low-precision floating-point compute, providing much higher compute density than other solutions.

Figure 1:
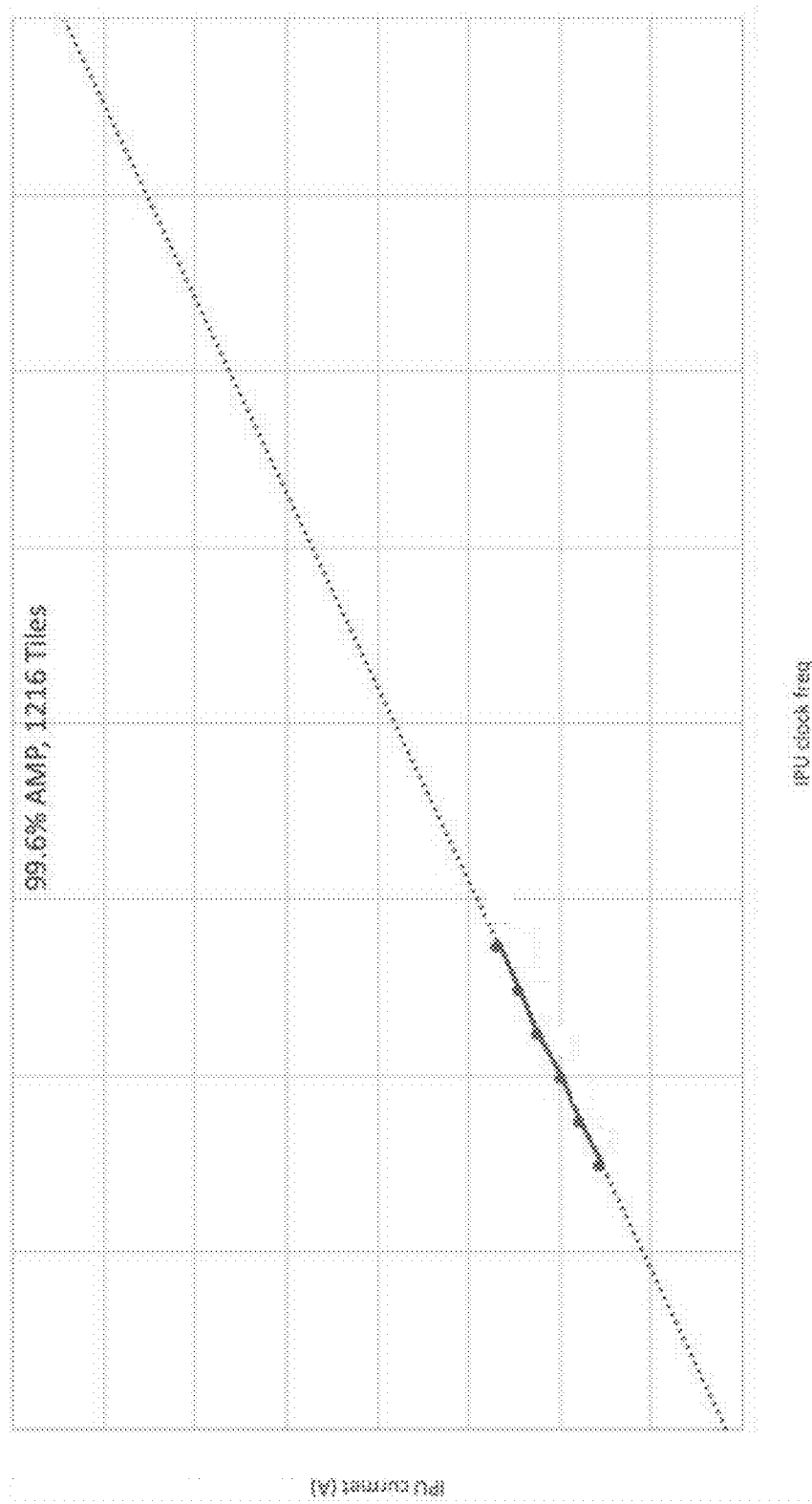
FIG. 1 is a graph showing the relationship between drawn current and clock frequency.

FIG. 1 shows the relationship between current drawn by the IPU in amps and the frequency of the IPU clock in MHz. The graph shows data collected form an IPU comprising 1216 tiles. A linear relationship between drawn current and clock frequency can be seen. That is, the higher the frequency the higher the current demand of the chip.

Very significant current steps can occur when most tiles of the IPU begin or cease to issue AMP instructions, which are the compute instructions supplied to the execution unit in each tile.

Different amounts of current are drawn by the IPU depending on the function it is performing. When the IPU changes function or behaviour, the drawn current changes. One example of when very significant current steps occur is during "bulk synchronous parallel" (BSP). According to BSP, each tile in a multi-tile array performs a compute phase and an exchange phase in an alternating manner During the compute phase each tile performs one or more computation tasks locally on tile but does not communicate any results of its computations with any others of the tiles. In the exchange phase each tile is allowed to exchange one or more results of the computations from the preceding compute phase to and/or from one or more others of the tiles in the group, but does not yet begin a new compute phase until that tile has finished its exchange phase. Further, according to this form of BSP principle, a barrier synchronization is placed at the juncture transitioning from the compute phase into the exchange phase, or transitioning from the exchange phases into the compute phase, or both. That is it say, either: (a) all tiles are required to complete their respective compute phases before any in the group is allowed to proceed to the next exchange phase, or (b) all tiles in the group are required to complete their respective exchange phases before any tile in the group is allowed to proceed to the next compute phase, or (c) both. When used herein the phrase "between a compute phase and an exchange phase" encompasses all these options.

The current demand for six different clock frequencies was measured and the results plotted on the graph of FIG. 1, represented by the numbered dots, the numbers indicating the measured current in amps. These measurements were taken while issuing AMP instructions almost continuously on all 1216 tiles of the IPU. A straight line has been fitted through the results because current is proportional to clock frequency.

High currents are, therefore, desirable for performance. However, these high currents exacerbate supply voltage droop problems, particularly when the current demand is made instantaneously across multiple processing units on the chip.

In the existing package structure for one or more IPU chips, capacitance is be provided at three levels. The first level is capacitance provided close to the circuit, referred to herein as die capacitance. This capacitance has the most immediate effect as is electrically closest to the current drawing circuit, in this case the chip, such that the parasitic impedance and resistance are smallest but it is usually small.

Figure 15:
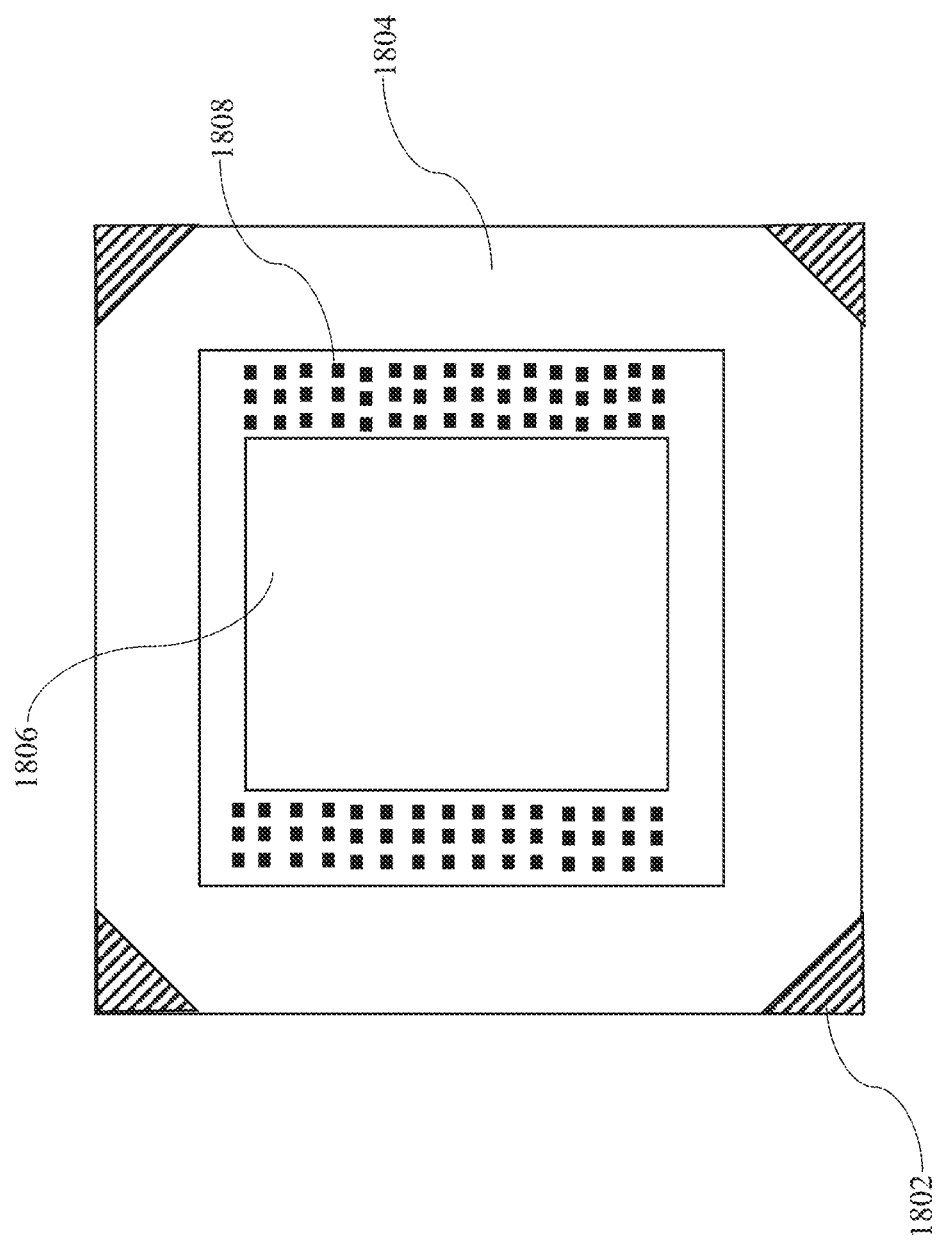
FIG. 15 is a schematic diagram of a structure comprising an IPU.

The second level of capacitance is that provided at the edges of the die (see FIG. 15). This capacitance may be referred to herein as package capacitance. This capacitance is electrically further away from the current drawing circuit than the die capacitance, with more interposed resistance/inductance so its effect takes longer to be useful.

The third level is referred to herein as an "external" capacitance. This is the capacitive effect of pads on a printed circuit board (PCB) on which the die is mounted (see FIG. 15). This takes even longer to take effect in the event of a load step due to the physical distance between the pads and the die.

Figure 13:
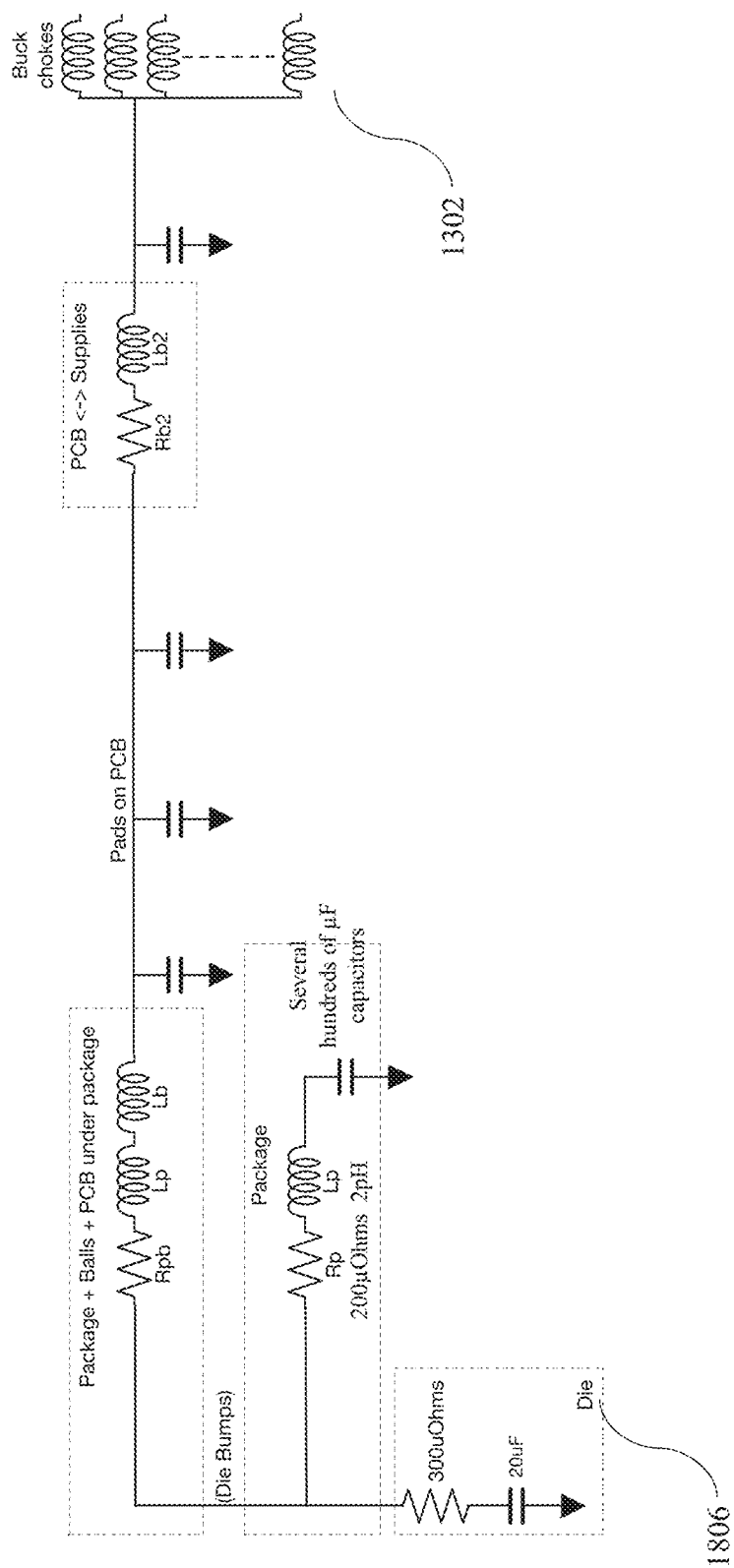
FIG. 13 is a circuit diagram illustrating the three levels of capacitance.

FIG. 13 is a circuit diagram showing the resistance, inductance, and capacitance (RLC) components of circuitry connecting a power supply 1302 to the chip 1806. In this example, the chip is a Graphcore Colossus Mk2 chip. The die capacitance (first level), package capacitance (second level), and PCB capacitance (third level) are all shown in the circuit diagram of FIG. 13.

Figure 2:
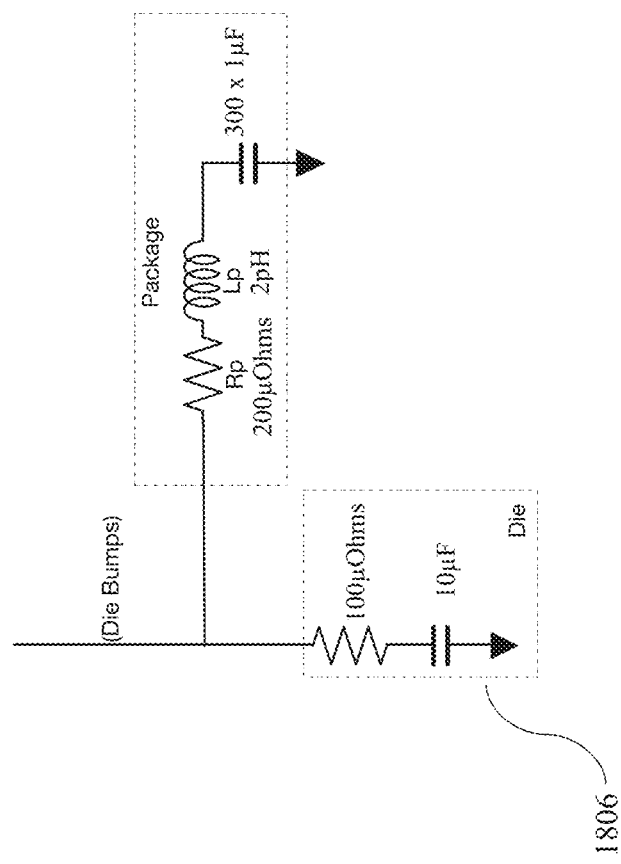
FIG. 2 is a circuit diagram illustrating the first two levels of capacitance.

FIG. 2 is a circuit diagram representing the first two levels of capacitance. The chip 1806 in FIG. 2 is a Graphcore Colossus Mk1 chip.

It will be appreciated that although specific values are given in FIGS. 2 and 13 for the capacitance, resistance, and inductance of the components of the circuit, other circuitry components may be used such that the values differ.

The first level of capacitance is provided by the die 1806, which, in this example, has a capacitance of order 10 µF, for example in the range 5 to 30 µF, 10 µF and a resistance of order 100 µOhms. The capacitance and resistance are inherent in the circuit elements on the die 1806.

The circuit diagram of FIG. 2 also represents a second level of capacitance as provided by capacitors 1808. There are several hundred micro farads of capacitance comprised of several hundred discrete capacitors, for example 300 capacitors, each with a capacitance of 1 µF, an inductor of order 2 pH and a resistor of order 200 µOhms. The several hundreds of discrete capacitors 1808 are positioned around the die 1806 in order to minimise the series parasitic inductance and resistance, specifically provided to add capacitance to the package. The package inductance and resistance may be referred to as a parasitic inductance and resistance respectively as they are not specifically introduced into the circuit, but rather are inherent inductance and resistance effects that are present in real electronic devices. The second level of capacitance is in the order of 100 s of µF.

Using the gradient of the straight line in FIG. 1, the switched capacitance is calculated using the equation:

$$C = \frac{I}{VF}$$

where C is the capacitance, I is the current, V is the voltage, and F is the clock frequency. It is roughly 2.5% of the total estimated on-die capacitance.

The supply voltage "droop" correlates with the capacitance usage but accumulates over clock cycles at high frequency. At each clock cycle, there is a supply voltage droop of 2.5%, corresponding to the percentage of the on-chip capacitance calculated above. This is because 2.5% of the on-chip capacitance is switching at every clock cycle. The supply voltage drop accumulates over multiple clock cycles and can in some cases consume the total on die capacitance.

In this example, only 4 clock cycles can occur before the on-chip capacitance is depleted by 10%. Soon after the depletion of the on-chip capacitance, the off-chip capacitance, such as the package capacitance, is relied upon. When the on-chip capacitance is small in comparison to the capacitance associated with each clock cycle, as is the case here, the off-chip capacitance is relied upon after a very short period of time. This is explained in more detail later, with reference to FIG. 5.

FIG. 13 shows an RLC circuit diagram for the supply decoupling of the Graphcore Colossus Mk2 logic chip. As mentioned above, this circuit represents all three levels of capacitance: the die capacitance and package capacitance as also shown in FIG. 2, and additionally the external capacitance. The external capacitance is located on the other side of the die bumps to the chip, i.e. between the power supply and the die bumps.

The die is shown to have a capacitance of order 20 µF, for example in the range of 5 to 30 µF, and resistance of order 300 µOhms. The package has a resistance of order 200 µOhms, an inductance of order 2 pH and a capacitance of order of several hundreds of micro farads, for example around 800 µF.

Frequency components of the load transient below approximately 2 MHz are dealt with by a combination of larger (bulk) capacitors on the PCB close to the package and by the power supply feedback loop that monitors the supply voltage at the die and reacts to voltage droop by delivering more current.

The third level of capacitance, shown in FIG. 13, is in the order of 1000 s of µF and has 10 s of pH of parasitic series inductance It will be appreciated that the values for resistance, inductance, and capacitance presented herein above for existing packages are given by way of example. There is a wide variation in package design and in power supply arrangements. However, in all cases there is a need to improve on die capacitance, particularly to deal with high frequency, high current demands. Each discreet capacitor illustrated in FIG. 13 has a significant intrinsic series resistance and inductance, which are not illustrated in the RLC diagram.

Parasitic inductances affect when the various discrete capacitors become effective. The on-die capacitance overtakes effect from 0 to 0.25 ns after a load step. The package capacitance takes effect after about 10 ns. The package/balls and PCB capacitance takes effect after about 250 ns. Most power supplies incorporate a regulator which operates a capacitance feedback loop intended to accommodate voltage droop, but this reacts in a longer time frame, e.g. 1-2 µs.

Figure 3:
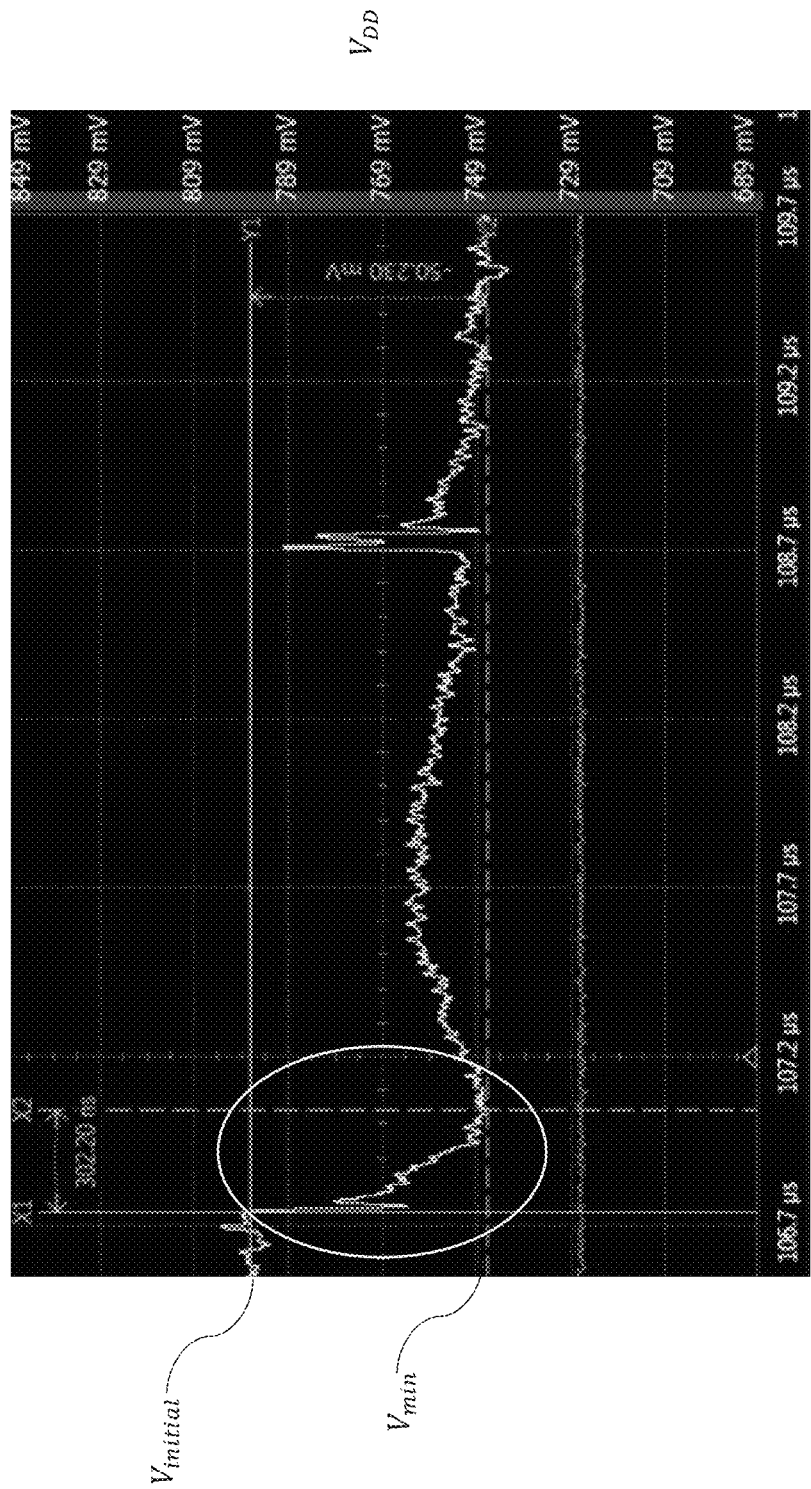
FIG. 3 is a graph showing an example load step response of a Colossus Mkt1 chip.

FIG. 3 shows a load step response of the Colossus Mk1 chip when a load step is applied, resulting in a voltage drop of around 50V. The load step corresponds to a change in current demand from the on-chip processing circuitry when it is carrying out compute operations.

For example, there is a load step when the chip behaviour changes from performing calculations, which requires high power, to exchanging data between tiles, which is less compute intensive. Such a load step may be exacerbated in BSP structures as described earlier.

It is desirable to avoid sharp changes in the supply voltage V. Ideally, the supply voltage would remain constant, such that changes in current have no effect on the supply voltage. However, due to the imperfect properties of electrical components, this is unlikely to be achievable. The aim, therefore, is to reduce the droop in supply voltage and smooth out sharp changes in the supply voltage.

In FIG. 3, the initial supply voltage, $V_{initial}$, applied to the IPU is roughly 800 mV. The minimum voltage, $V_{min}$, is around 750 mV. There is a predefined minimum supply voltage which is the lowest voltage at which the chip will operate safely, below which the supply voltage cannot fall. Therefore, the supply voltage $V_{DD}$ must be margined to guarantee the $V_{min}$ experienced at the die is not lower than the predefined minimum supply voltage.

The minimum supply voltage experienced at the die is affected by the transient response of the voltage to a load current. This includes a supply voltage droop having a profile which may include an undershoot. Voltage droop is the phenomenon of the supply voltage decreasing in response to an increase in current drawn until a regulator acts to maintain the supply voltage. This, therefore, needs to be accommodated for. Currently, this is achieved by increasing the initial supply voltage such that the minimum supply voltage experienced in the undershoot is above the predefined minimum supply voltage.

Figure 4:
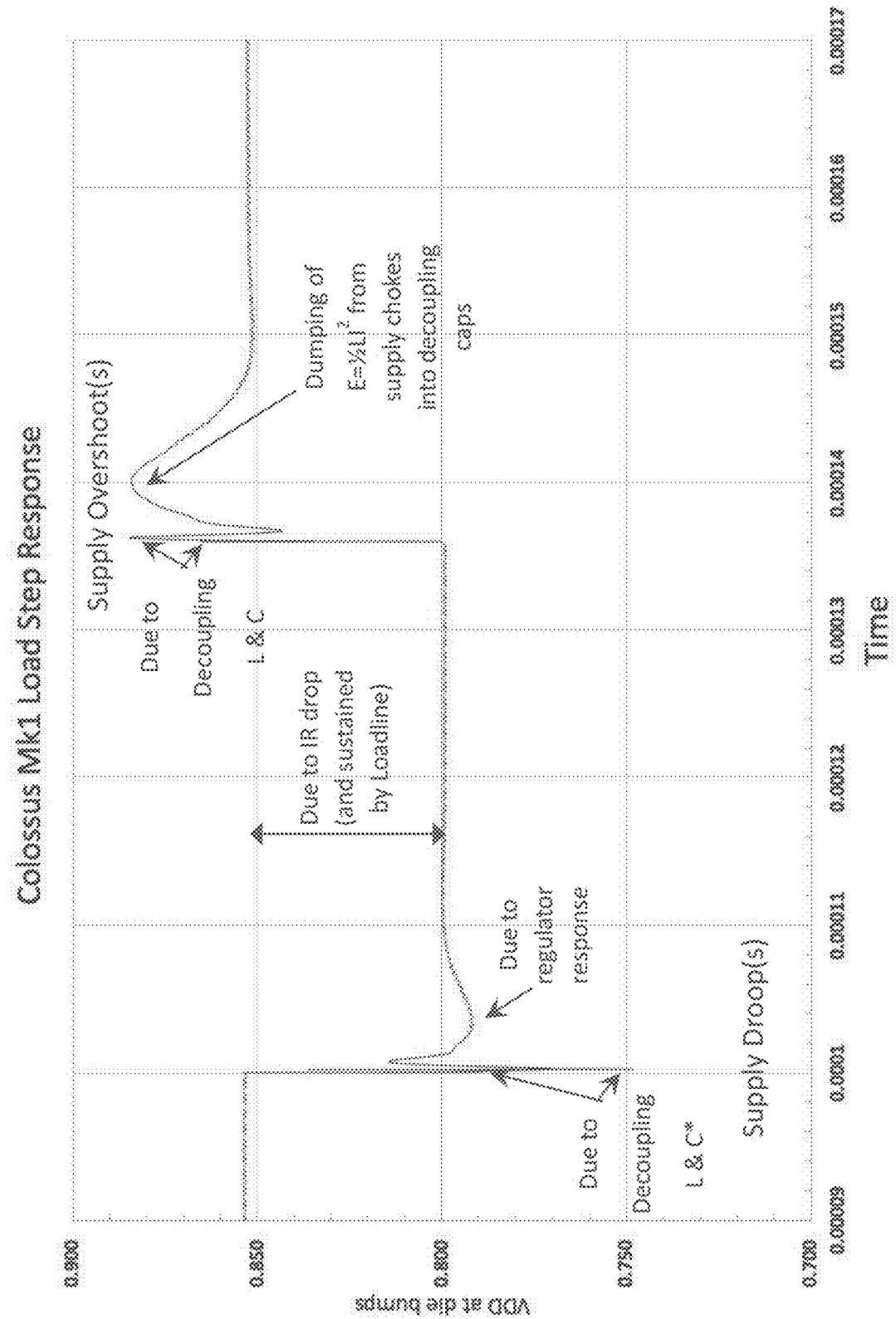
FIG. 4 shows a load step response simulation of a chip.

FIG. 4 shows a load step response simulation using the Graphcore Colossus Mk1 chip, as represented in FIG. 2.

The graph shows an initial voltage of about 0.8-0.9V supplied at the die bumps of the IPU, i.e. a voltage of the order of 1V. Time is plotted on the x-axis and supply voltage on the y-axis. At t=0.0001 s, there is a load step increase in current demand from 80 A to 300 A, which results in the load step response shown around time t=0.0001 s.

The initial supply voltage is the supply voltage at no load. When load is applied, e.g. when the current demand increases, the current flows through the electrical components such that the inherent resistance and inductance of these components causes the supply voltage to drop.

The supply voltage can be seen to settle at around 0.8V. The difference between the initial supply voltage and the settled, or steady-state, supply voltage is due to the IR drop and maintained by the stable loadline.

However, before settling, there are supply voltage undershoots below that of the steady-state voltage. An undershoot occurs in the transient response when the supply voltage falls sharply below a smooth notional voltage droop curve.

There is a first undershoot due to the decoupling of the parasitic inductance and capacitor components of the elements shown in FIG. 2. There is another undershoot later due to the regulator response. The undershoots are described in more detail later with reference to FIG. 5.

Later, at time t=0.00136 s, there is a second load step response as a result of a load release, reducing the current demand. That is, the current drops and so the supply voltage increases.

There are two resultant overshoots, the first due to the decoupling of the inductor and capacitor components of FIG. 2, and the second due to the dumping of voltage from supply chokes (see FIG. 13) into decoupling capacitors. The voltage dumping follows from the following equation:

$$E=0.5LI^2$$

where L is the effective inductance and I is the current being drawn by the chip.

Figure 5:
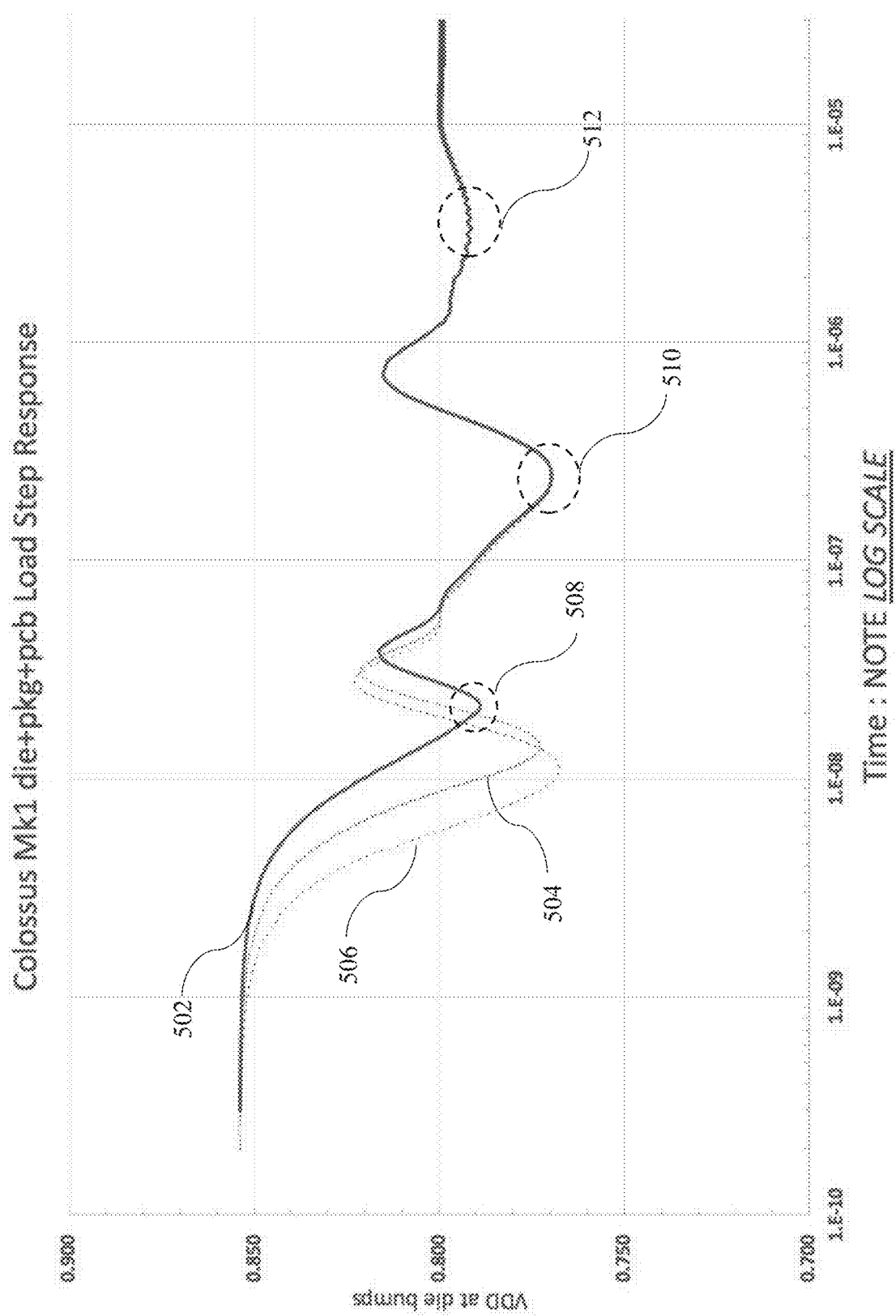
FIGS. 5 and 6 show expanded views of the load step response simulation.

FIG. 5 shows the undershoots in supply voltage as a result of the step response at time t=0.0001 s, as discussed with reference to FIG. 4, in more detail. The x-axis shows time after the load step on a logarithmic scale.

There are three undershoots 508, 510, 512 shown in the graph. Three different graphs 502, 504, 506 have been plotted, each graph representing a different step time duration. The step time duration is the time taken for the current to be applied. The longer the step time duration the longer the delay before the first minimum voltage is realised because a shorter time step duration results in the on-chip capacitance being depleted more quickly. However, the three graphs 502, 504, 506 tend to the same shape and it can be seen that the three graphs meet at the second undershoot minimum and subsequently follow the same shape. The three time steps durations shown are 5 ns, 10 ns, and 20 ns, corresponding to graphs 506, 604, and 502 respectively. The 20 ns time step duration plot 502 is discussed in further detail below.

The first undershoot in supply voltage occurs as the die capacitance discharges. The first supply voltage undershoot 508 has a minimum voltage of around 0.79V, occurring approximately 10 ns after the load step. This minimum voltage value may be calculated from the load step time duration (a shorter step time duration results in a lower minimum voltage), the capacitance of the die, and the series impedance of the package. The minimum voltage occurs when the capacity of the on-chip capacitance has been exhausted, as discussed above.

As the supply voltage falls due to discharging the on-die capacitance, the voltage across the inductance in series with the on-die capacitance builds up. Once this voltage is high enough, the supply voltage stops falling and begins to rise.

The voltage rises briefly before falling again, this time as a result of the capacitors of the package discharging. The second supply voltage undershoot 510 minimum is sensitive to the capacitance of the package capacitors and the series impedance of the PCB. The supply voltage minimum occurs approximately 250 ns after the load step and has a minimum value of around 0.77V.

As the supply voltage falls for the second time, voltage builds up across the bulk inductors. Once this voltage is high enough, it prevents the supply voltage from falling any further, and then results in the supply voltage rising until it reaches a peak.

After the peak, the supply voltage falls for a third time, this time due to the discharging of the capacitance of the PCB. This capacitance is shown in FIG. 13. The minimum supply voltage occurs approximately 3 μs after the load step. The minimum value is around 0.79V. The minimum voltage is sensitive to the capacitance of the PCB and the supply control loop response.

After the third supply undershoot 512, the supply voltage rises and settles at the steady-state supply voltage, approximately 0.8V. This is due to the response of the regulator.

Figure 6:
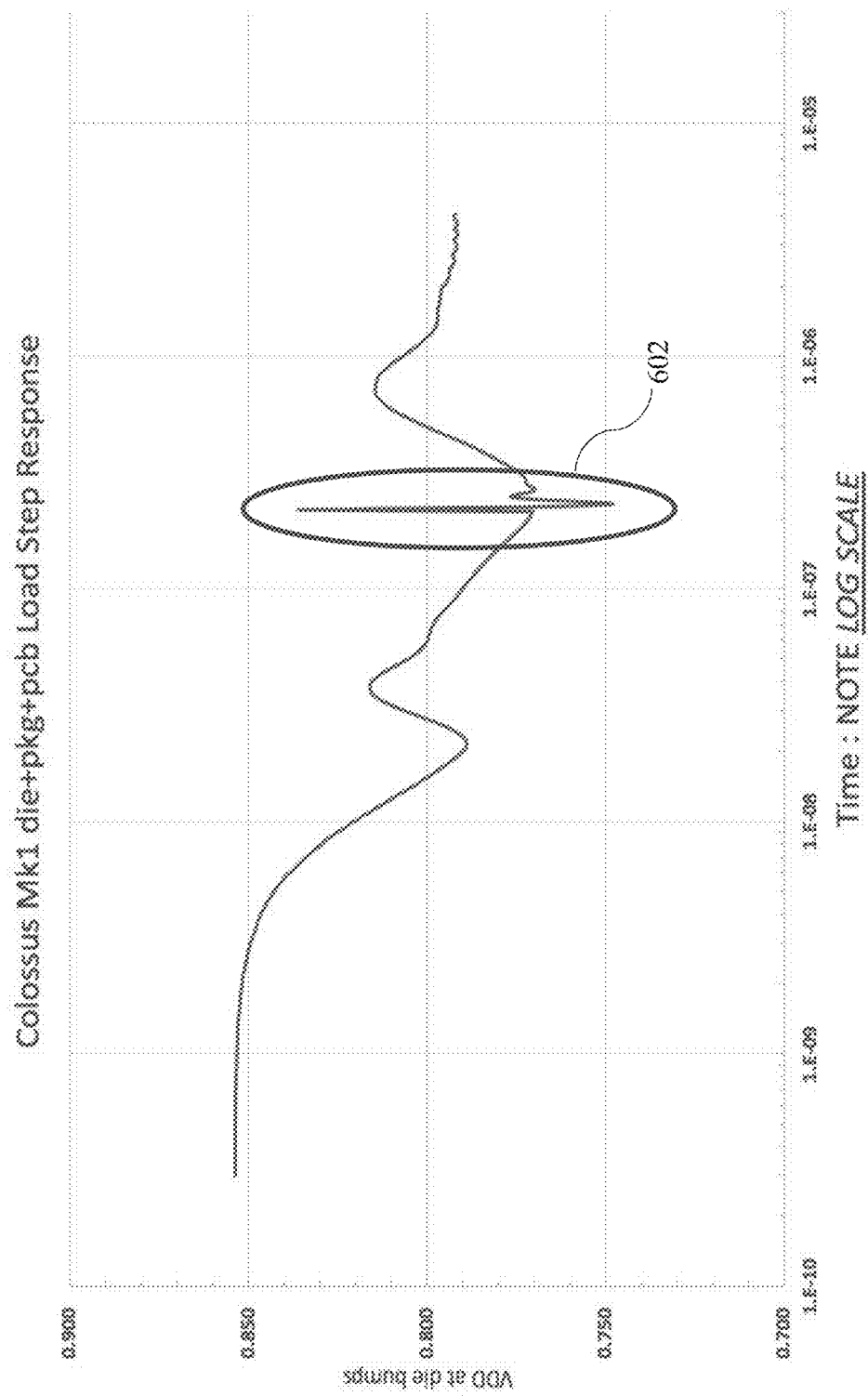

FIG. 6 shows the 20 ns time step graph of FIG. 5 but with an additional supply voltage spike 602 at around 250 ns. This spike 602 has a minimum value of around 0.75V.

Another cause of a load step in current is turning the clock on and off (for example to ensure a current clock is deselected safely before implementing a different clock).

The spike 602 occurring at 250 ns is due to the brief 3 ns load release caused by a clock deselect signal. Here, the clock is stopped momentarily and then restarted, such that the current drops from 300 A to 0 A and then increases back to 300 A very quickly.

The supply voltage has a predetermined minimum below which it is undesirable for the supply voltage to fall. This minimum supply voltage is determined by the minimum voltage at which the hardware can function as intended. Below this minimum voltage value, faults occur. The predetermined minimum allowable voltage value may be defined as being an amount higher than the absolute minimum voltage at which the IPU can function to ensure that no faults occur in the case that an unexpectedly low supply voltage occurs (undershoot).

Currently, the only way to ensure $V_{min}$ does not drop below the minimum allowable supply voltage is increase the initial supply voltage. This has implications for both power consumption and performance, as described below.

Some embodiments aim to reduce the supply voltage undershoot.

Dynamic power is proportional to $V_{DD}^2 \times F$, that is the squared value of the supply voltage times the clock frequency.

By reducing the undershoot, the difference between the initial supply voltage and the minimum supply voltage experienced as a result of voltage droop is decreased, so the initial supply voltage can be lower while still limiting the minimum supply voltage to the predefined $V_{min}$ value. Thus, the frequency can be increased without changing the dynamic power.

For example, if the undershoot can be reduced by 5%, $V_{DD}$ can also be reduced by 5%. To maintain the same dynamic power, the clock frequency can then be increases by $$\left(\frac{1}{0.95}\right)^2 = 0.11$$

so the clock frequency can be increased by 11%. Since performance is proportional to clock frequency, the performance can also be increased by 11%.

Some aspect have been developed in the context of an IPU architecture with multiple on die parallel processing units operating synchronously. Such a die is described with reference to FIG. 16. It will be appreciated, however, that embodiments have wider applicability to reduce voltage droop in chip process supplies.

Figure 16:
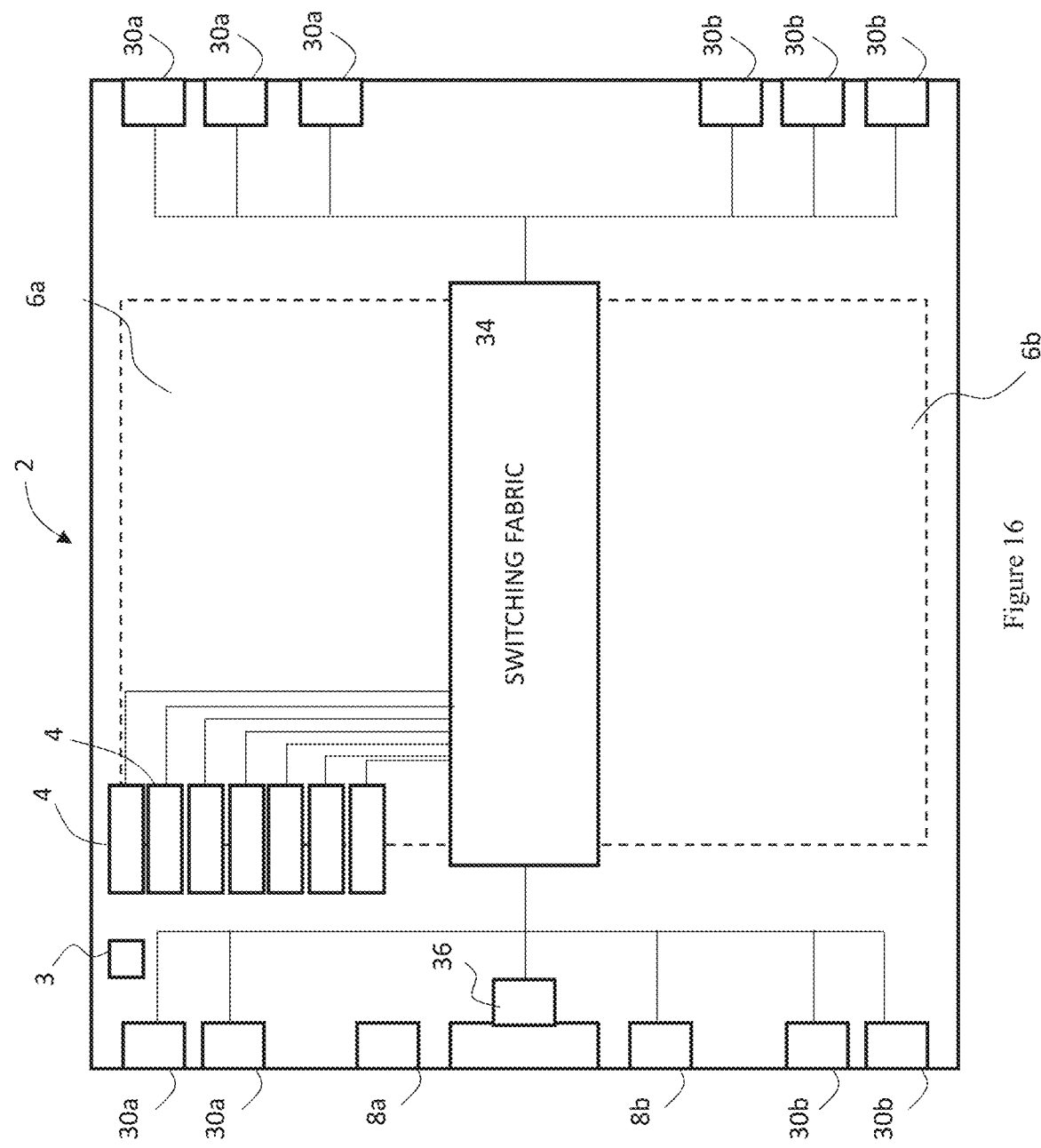
FIG. 16 is a schematic diagram of the architecture of a single chip processor.

FIG. 16 illustrates schematically the architecture of a single chip processor 2. The processor 2 comprises multiple processing units referred to as tiles. In one embodiment, there are 1216 tiles organised in arrays 6a, 6b. In the described example, each array has eight columns of 76 tiles (in fact generally there will be 80 tiles, for redundancy purposes). The chip 2 has two chip-to-host links 8a, 8b and 4 chip-to-chip links 30a, 30b arranged on one edge of the chip 2 The chips can be connected together into cards by a further 6 chip-to-chip links 30a, 30b arranged along the other edge of the chip.

The chip 2 has a clock 3 which controls the timing of computer operations and other chip activity. The clock is connected to all of the chip's active circuits and components. The chip 2 comprises a switching fabric 34 to which all tiles and links are connected by sets of connection wires.

Each tile 4 has a processing circuit and local memory. The processing circuit comprises an execution pipeline with one or more execution units.

Figure 17:
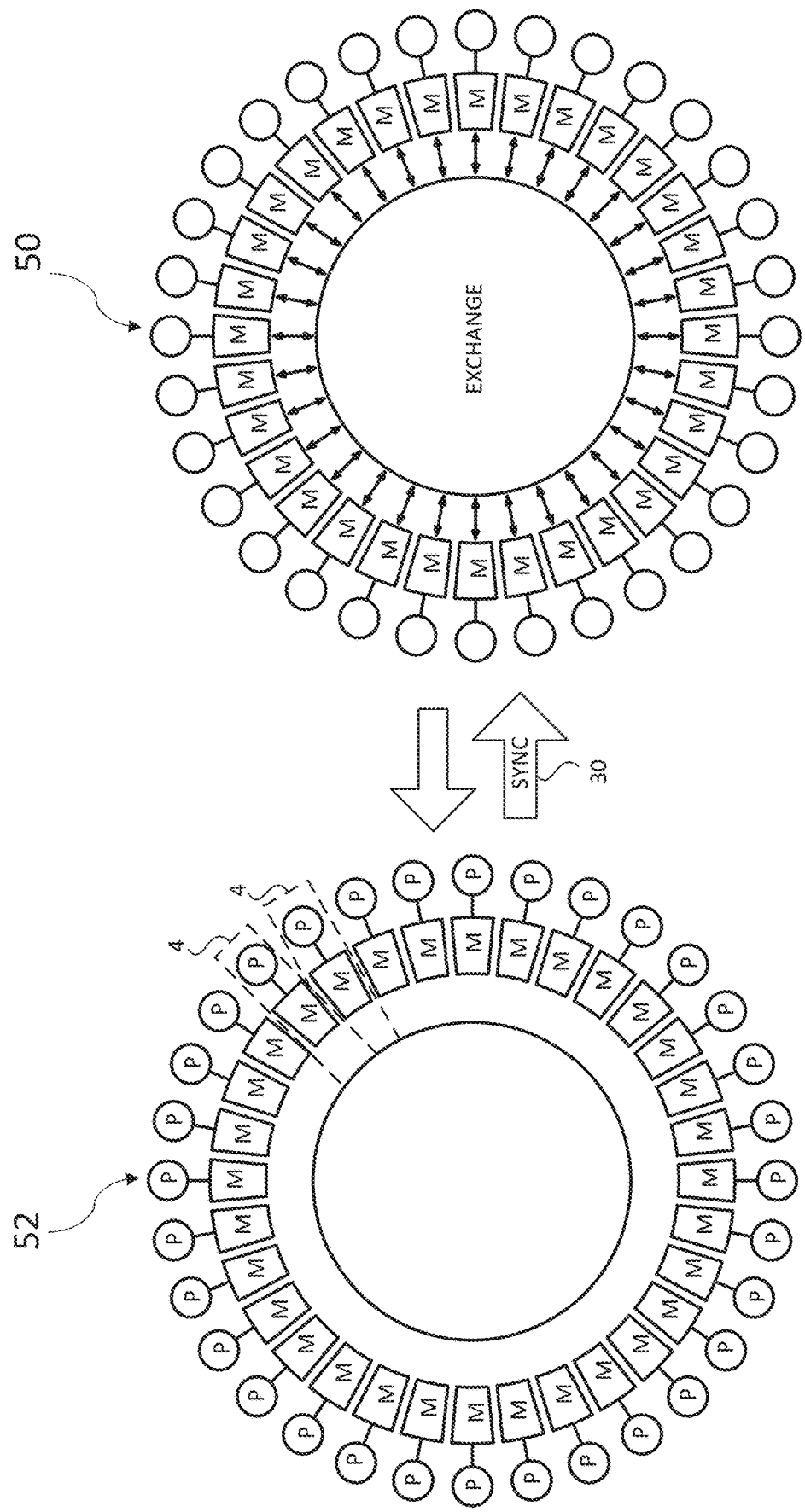
FIG. 17 illustrates a bulk synchronous parallel protocol.

The execution pipelines carry out processing operations, e.g. of mathematical computations, and are responsible for executing exchange instructions which cause data to be exchanged between tiles in the chip. Each chip operates a Bulk Synchronous Parallel protocol, comprising a compute phase and an exchange phase. The protocol is illustrated for example in FIG. 17. The left-hand diagram in FIG. 17 represents a compute phase in which each tile 4 is in a phase where the stateful codelets execute on local memory. Although in FIG. 17 the tiles 4 are shown arranged in a circle this is for explanatory purposes only and does not reflect the actual architecture.

After the compute phase, there is a synchronisation denoted by arrow 30.

BSP in itself is known in the art. According to BSP, each tile 4 performs a compute phase 52 and an exchange (sometimes called communication or message-passing) phase 50 in an alternating cycle. The compute phase and exchange phase are performed by the tile executing instructions. During the compute phase 52 each tile 4 performs one or more computation tasks locally on-tile but does not communicate any results of these computations with any others of the tiles 4. In the exchange phase 50 each tile 4 is allowed to exchange (communicate) one or more results of the computations from the preceding compute phase to and/or from one or more others of the tiles in the group, but does not yet perform any new computations that have a potential dependency on a task performed on another tile 4 or upon which a task on another tile 4 might potentially have a dependency (it is not excluded that other operations such as internal control-related operations may be performed in the exchange phase). Further, according to the BSP principle, a barrier synchronization is placed at the juncture transitioning from the compute phases 52 into the exchange phase 50, or the juncture transitioning from the exchange phases 50 into the compute phase 52, or both. That is it say, either: (a) all tiles 4 are required to complete their respective compute phases 52 before any in the group is allowed to proceed to the next exchange phase 50, or (b) all tiles 4 in the group are required to complete their respective exchange phases 50 before any tile in the group is allowed to proceed to the next compute phase 52, or (c) both of these conditions is enforced. This sequence of exchange and compute phases may then repeat over multiple repetitions. In BSP terminology, each repetition of exchange phase and compute phase is referred to herein as a "superstep", consistent with usage in some prior descriptions of BSP. It is noted herein that the term "superstep" is sometimes used in the art to denote each of the exchange phase and compute phase.

One effect of the BSP protocol is to exacerbate the effects of current draw requirements because all or many tiles compute at the same time and exchange at the same time. The current draw requirements are much higher for compute than they are for exchange. Therefore, there is a large load step, corresponding to a large increase in current drawn, when the tiles start their compute phase simultaneously, and a second large load step, this time corresponding to a large decrease in current drawn, when the tiles start their exchange phase simultaneously.

FIG. 15 shows an illustration of a structure comprising an IPU. A package substrate 1802 forms a base layer onto which components are attached. The package substrate 1802 is a printed circuit board (PCB).

A die (or chip) 1806 is placed on to the package substrate 1802. The die 1806 comprises logic which is used to perform computations.

Around the die 1806 is an array of capacitors 1808. The capacitors are multilayer ceramic capacitors with dimensions of 0.5 mm by 1 mm. These capacitors 1808 are placed on the package substrate 1802 as close to the die 1806 as possible so as to reduce the inductance between the circuits drawing the current and the capacitance. These discrete capacitors 1808 are considered to provide the "on-chip" capacitance as explained above. It will be appreciated that by using aspects of embodiments described in the following, such capacitances may be reduced in number or eliminated entirely by providing a time on die capacitance.

There is a stiffener ring 1804 around the capacitors 1808. The stiffener ring 1804 is a metal ring which is attached to the surface of the package substrate 1802 using epoxy glue. The stiffener ring 1804 improves the robustness of the die.

The structure of FIG. 15 is constructed using flip-chip technology, as known in the art. The die 1806 is attached face-down to the package substrate 1802 using solder bumps or C4 balls. These are balls of solder which are attached to the topside of the chip 1806. Once the die 1806 is in place on the package substrate 1802, the structure is heated such that the C4 balls melt and the die 1806 soldered in place on the package substrate 1802. This process may be referred to as "packaging".

The package substrate 1802 also comprises an array of solder balls. This array is on the underside of the package substrate 1802 and is used to connect the package to a PCB. The package solder balls are much larger than the C4 balls and have a larger pitch. The C4 balls are a type of connector terminal.

Other types of connector terminals, that is means for connecting the chip to other components, may be used. The form the connector terminals takes may depend on the type of packaging and/or the method of connecting to the packaging. For example, copper pillars are used as the connector terminals when the chip is connected to conventional packaging, and micro-bumps are used as the connector terminals for flip-chip on a silicon interposer.

According to some embodiments there is provided a solution for reducing supply voltage undershoot which uses wafer-on-wafer technology to provide surface distributed capacitance with a very low series impedance to the chip processing circuitry.

A distributed capacitor wafer 904 is stacked with a processor chip wafer 902. This stacking may be referred to as wafer-on-wafer (WoW) herein. In the present disclosure, the processor chip wafer referred to may be the Colossus Mk1 and Mk2 chips manufactured by Graphcore, although it will be appreciated that any processor chip may be used.

Figure 9:
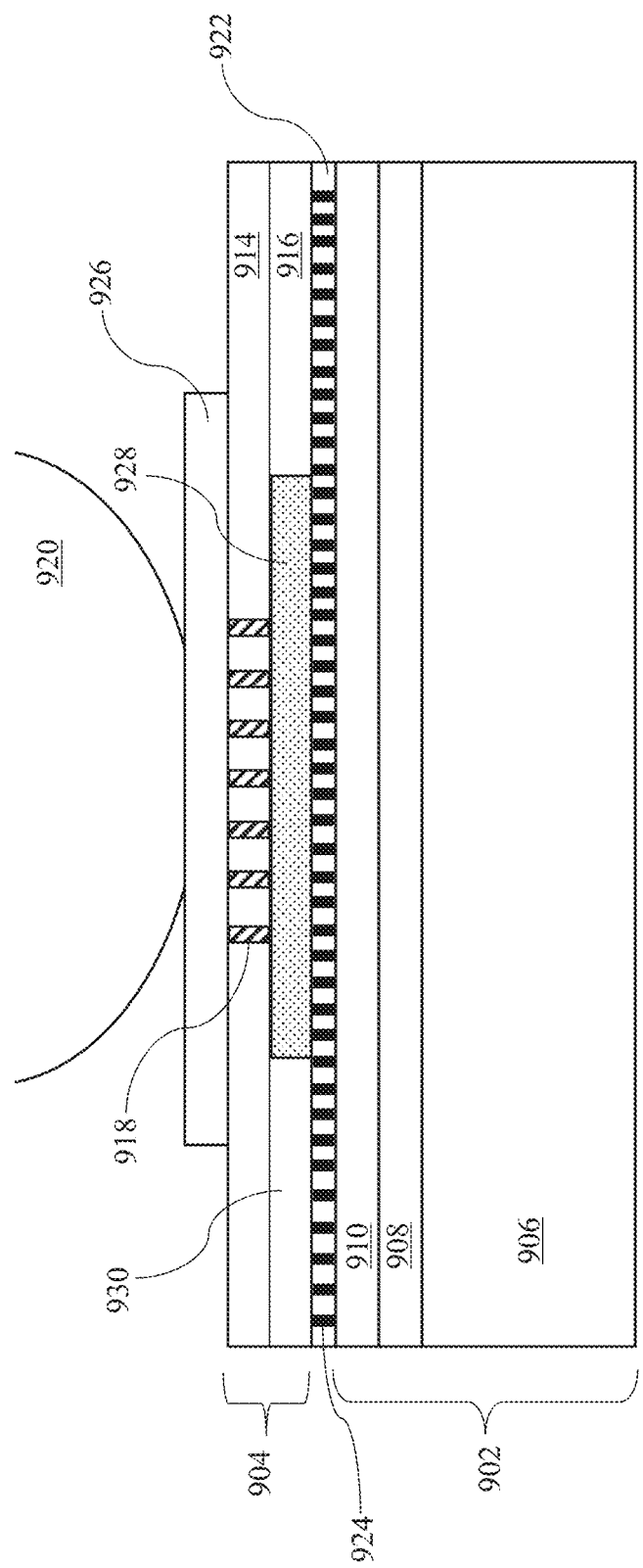
FIG. 9 is a schematic diagram of an example stacked die.

The processor wafer 902 is a first silicon wafer. That is, it is forms the bottom of a stacked die before it is flipped via 'flip-chip'. The distributed capacitor or DRAM wafer 904 is a second silicon wafer which forms the top of the stacked die. The arrangement of the wafers 902, 904 prior to flipping is shown in FIG. 9 and explained in more detail later.

A respective bonding layer 922 is formed on an "inner" surface of each of the wafers 902, 904, which provides connections between the two wafers 902, 904. The bonding layer 922 is described in more detail later. The DRAM wafer 904 is then stacked on top of the processor wafer 902, such that the two bonding layers 922 are in contact and aligned.

Once stacked, the DRAM wafer 904 is thinned Wafer thinning can be achieved using a known technique to achieve thinning of a substrate to achieve a desired flatness, such as chemical mechanical polish. It will be appreciated that other suitable known techniques may be used.

The DRAM wafer 904 is thinned after stacking so that the processor wafer 902 can provide sufficient support to the DRAM wafer 904. The DRAM wafer 904 is thinned to be only a few microns thick, for example the thinned thickness may be in the range of 3 to 10 µm. In contrast, the processor wafer 904 may be around 700 µm thick, or in the range of 400 µm to 1000 µm. The processor wafer 902 has a self-supporting depth, that is the depth of the processor wafer 902 is sufficient that the processor wafer 902 can support itself without an additional substrate.

The DRAM wafer 904 is thinned such that it has a non-self-supporting depth, such that the DRAM wafer 904 would not be able to support itself without some kind of supporting layer, here the processor wafer 902.

Through silicon vias (TSVs) 918 are created in the DRAM wafer 904, which provide connections to the processor wafer 902. TSVs 918 can be created using a known technique such as plasma etching to achieve a depth to width ratio with a pre-defined sidewall angle, the side wall angle being the acute angle that the sidewall of the TSV makes with the horizontal plane. The TSVs are created after the wafers 902, 904 are stacked and the DRAM wafer 904 thinned. This enables the TSVs to be formed with very small diameter and at a very low pitch in the stacked die, each TSV 918 has a diameter in the range of 2 to 5 µm. This is much smaller than the TSVs used in traditional CPUs. The pitch of the TSVs 918 (the distance between them) may be in the range of 2 to 5 µm.

An under ball metallisation (UBM) layer 926 is formed on "outer" surface of the DRAM wafer 904. The UBM layer 926 is a pad on the surface of the DRAM wafer 904 onto which one or more solder dot or C4 ball 920 is deposited. The stacked wafers 902, 904 can then be connected to external circuitry using a controlled collapse chip connection, or "flip chip", method, as known in the art. The C4 balls form the connections between the stacked wafers 902, 904 and the external circuitry. It will be appreciated that, in embodiments using different types of connector terminals, there may not be a UBM layer 926.

The capacitor layer acts as a power supply decoupling capacitor in the present arrangement and comprises multiple blocks (capacitor units) of DRAM cells. DRAM cells comprise large, dense arrays of capacitors. Currently, around 40 nm DRAM cells achieve approximately 1500 fF/µm$^2$ of capacitance. Over the full approximately 800 mm$^2$ of the die, this would have a total capacitance of around 1200 µF. It will be appreciated that these values are provided by way of example, and that components with other properties be used FIG. 9 shows an example of a structure formed as the result of stacking a processor wafer 902 and a DRAM wafer 904 to form a stacked die.

The processor wafer 902 comprises several layers. The bottom layer is the processor wafer substrate 906. The processor wafer 902 also comprises a finFET and BeOL layer 908. This layer sits on top of the processor wafer substrate 906. It will be appreciated that the term "on top" and "below" do not necessarily define any particular orientation, but rather defines a relative position of layers to one another.

Top metal (Mr) layers 910 are added on top of the finFET and BeOL layer 908. The Mr layer 910 replaces application processor (AP) and/or redistribution (RDL) layers of a processor wafer 902 for use without the WoW capacitor layer.

The DRAM wafer 904 is located on top of the processor wafer 902. The DRAM wafer 904 may be face-down, such that an exposed ("outer") surface of the wafer 904 is a backside of the wafer. Alternatively, the backside of the DRAM wafer 904 may be in contact with the top of the processor wafer 902, such that the exposed surface of the DRAM wafer 9044 is the topside of the wafer. The example shown in FIG. 9 shows the DRAM wafer 904 to be face-down, with the backside of the wafer exposed.

The exposed surface of the wafers 902, 904 is the surface that is not in contact with the other wafer 902, 904. That is, the exposed ("outer") surface of the processor wafer 902 is the bottom surface of the processor wafer substrate 906 in FIG. 9, and the exposed ("outer") surface of the DRAM wafer 904 is the top surface of the DRAM wafer substrate layer 914 in FIG. 9.

The backside of the wafers 902, 904 refers to the side of the substrate layer 906, 914 on which no additional layers are placed. Taking the processor wafer 902 as an example, the backside of the processor wafer 902 is the underside of the processor substrate layer 906. A topside of the wafers 902, 904 is the opposite side of the wafer 902, 904. This is the side of the outermost layer which comprises circuitry, e.g. the top of the Mr layer 910 of the processor wafer 902. The topside of the wafer 902, 904 must be connected to the supply voltage, whereas no connections need to be made to the backside since there is no current consuming circuitry located there.

The surface of the wafer 902, 904 which faces the other wafer 904, 902 and is in overlap with the other wafer 904, 902 may be referred to as an inner facing surface. The inner facing surfaces of the two wafers 902, 904 are of equal shape and dimensions, such that the inner facing surfaces, when in overlap, match. This implies a common external shape and dimensions if the wafers when stacked.

It will be appreciated that the term "equal" used herein is not to be interpreted literally but rather as meaning approximately or preferably equal according to a pre-defined specification of distance and/or dimension according to design factors understood in the art.

The DRAM wafer 904 may comprise at least two layers: a capacitor substrate layer 914, which may be made of silicon, and a stacked capacitor layer 916.

The capacitor substrate layer 914 may be made of silicon. The capacitor substrate layer 914 has the through silicon vias (TSVs) 918 formed therein. These are positioned in the part of the layer 914 which sits directly beneath a C4 ball 920 to provide connections between the C4 balls and the topside of each wafer 902, 904. The C4 balls may provide connections to the supply voltage $V_{DD}$, ground voltage $V_{SS}$, and the I/P ports for example via a serialiser/deserialiser (SerDes). Note, each C4 ball 920 is associated with multiple TSVs 918.

The capacitor layer 916 may comprise two parts: a stacked capacitor part 930 and a capacitor free part 928. The capacitor free part 928 sits aligned with the part of the capacitor substrate layer 914 which comprises the TSVs. This part 928 of the layer 916 comprises vias and metal to allow for electrical connections from the TSVs 918 to the processor die 902.

The remaining area of the capacitor layer 916 comprises the capacitor part 930. These areas comprise stacked capacitors with, in the example, of FIG. 9, a capacitance of order 1/µm. The capacitor part 930 provides a stacked capacitor array.

The capacitor layer 916 is about 2 µm thick. The capacitor layer 916 may be coated with a metal oxide.

There may be an additional layer providing connection between the two wafers 902, 904. The layer may be a bonding layer 922 which allows connections between the two wafers 902, 904. Although shown as a single layer in FIG. 9, there may be a bonding layer 922 formed on each of the wafers 902, 904. The bonding layers of the wafers 902, 904 are mirror images of each other to provide the connections required. The bonding layer 922 may comprise an array of WoW connectors 924. These connectors provide the electrical connection between the DRAM die 904 and the processor die 902 such that the supply voltage connected to the C4 balls on the upper side of the structure can be supplied to the processor die 902.

Once the processor wafer 902 and the DRAM wafer 904 have been stacked, the capacitor substrate layer 914 may be thinned. Only one substrate layer 906, 914 can be thinned because the robustness of the structure needs to be maintained. The advantage of using a DRAM wafer 904 with separate substrate and capacitor layers 914, 916 is that the capacitor substrate layer 914 can be thinned more easily than if the capacitors are embedded in the substrate since no care needs to be take in order to avoid the capacitors.

The under ball metallisation (UBM) layer 926 sits on the exposed surface of the capacitor wafer 904, in this example the backside of the capacitor substrate layer 914, such that it forms a connection between the C4 ball 920 and the DRAM wafer 904.

The DRAM wafer 904 is used to provide capacitance and comprises a regular pattern of electrical connections which make it suitable for contact with the C4 balls. Furthermore, the resistance is lowered due to these connections.

By using approximately an area of approximately 25 µm by 25 µm of DRAM cells of about 15 fF/µm² capacitance, the total capacitance of the capacitor block is about 0.8 nF, and in the rage of 0.5 to 1.5 µF. This can be provided by approximately 54000 DRAM cell capacitors.

Figure 10C:
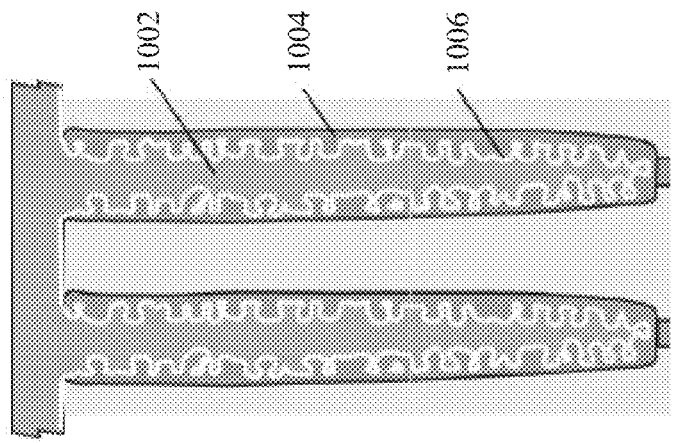
FIGS. 10 A-C show the structure of a DRAM cell capacitor.
Figure 10A:
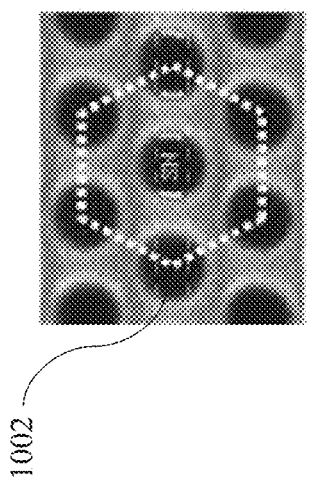
Figure 10B:
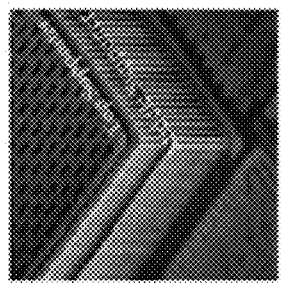

FIGS. 10A-C shows the structure of a DRAM cell capacitor.

FIG. 10A shows a plan view of a honeycomb structure of the DRAM cells. Each capacitor 1002 has six neighbouring capacitors 1002, each of which is located an equal distanced from all six of its neighbours. The honeycomb structure provides a constant packing density of capacitors 1002 and the density is higher than that in a square arrangement. Such a honeycombed structure of DRAM cells is known in the art. FIG. 11B shows a bird's eye view of the same honeycomb structure.

FIG. 10C is an illustration of two trench capacitors 1002. Trench capacitors 1002 are formed in the stacked capacitor layer 916 of the DRAM wafer 904. Trench capacitors may be formed using known techniques such as plasma etching.

The trench capacitors 1002 comprise a storage node 1004 and a dielectric film 1006 on the inner surface of the trench capacitor 1002. The storage node 1004 may comprise hemispherical grain polysilicon. This layer 1004 increase the surface area of the trench capacitor 1002. The storage node 1004 may, for example, double the surface area of the trench capacitor 1002.

The dielectric film 1008 forms a film over the surface of the storage node 1004. This film has a high dielectric constant. For example, it may comprise tantalum pentoxide, aluminium oxide, hafnium dioxide, or any other suitable material.

The trench capacitors 1002 have a high-aspect ratio of patterning, for example the ratio is greater than 10.

Figure 11A:
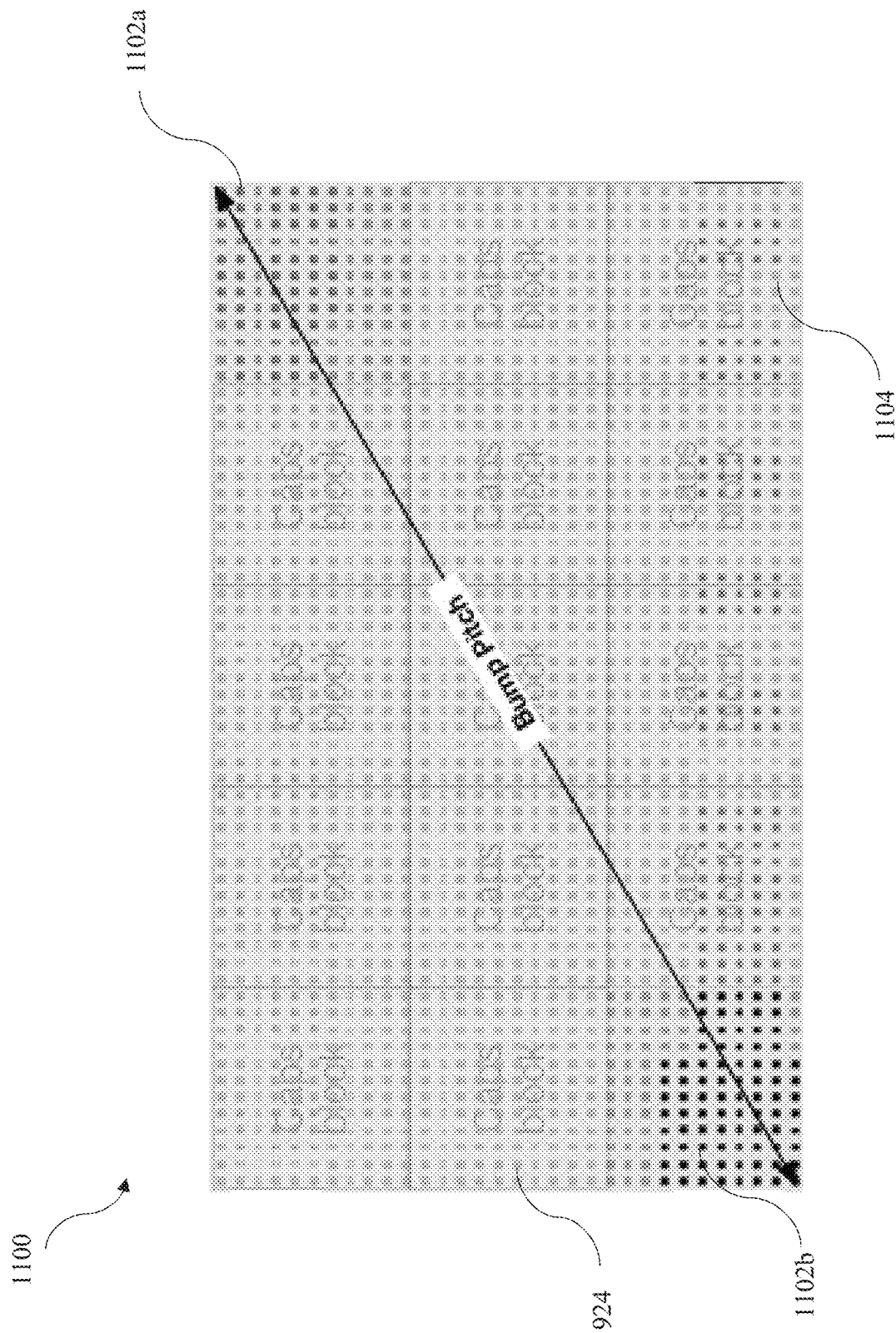
FIGS. 11A and 11B are schematic diagrams of repeatable capacitor units.
Figure 11B:
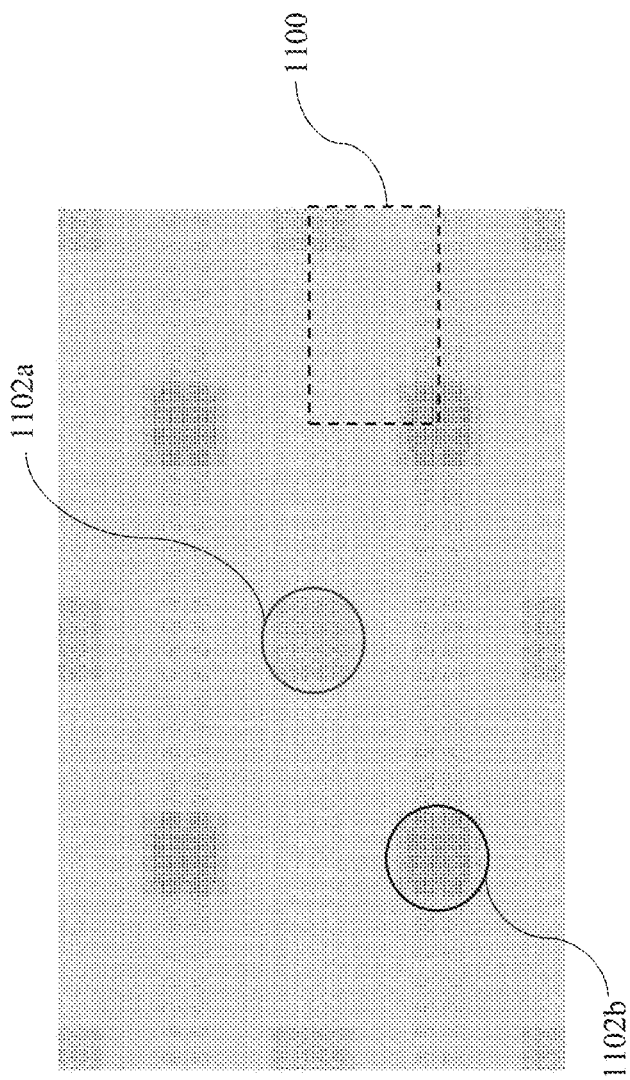

FIGS. 11A and 11B show repeatable capacitor units 1100 which can be used as the WoW capacitor wafer disclosed herein.

FIG. 11A shows a single repeatable capacitor unit 1100 with a total area of approximately 10000 µm² and capacitance of the order of 10 nF, for example in the range of 5 to 30 nF. The dimensions of the repeatable capacitor unit 1100 may be defined by the C4 ball pitch, as discussed later. The total distributed capacitance depends on the size of the processor wafer 902, the total area of the processor wafer 902 which is covered by repeatable capacitor units 1100, and the capacitance of the repeatable capacitor units 1100. The repeatable capacitor units 1100 cover at least 80% of the area of the processor wafer 902, as discussed with reference to FIG. 12. The total distributed capacitance provided for each die by the repeatable capacitor units 1100 is in the range of 650 µF to 850 µF. For die of different sizes, the total distributed capacitance will take different values. The distributed capacitance is greater than 0.5 µF/mm² and preferably in the range of 0.5 µF/mm² to 3 µF/mm². There may be a plurality of die patterned on each DRAM wafer 904. For example, there may be about 65 die patterned on each wafer. The number of die on each DRAM wafer 904 may depend on the size of the die.

The repeatable capacitor unit 1100 comprises 13 capacitor blocks 1104 and two keep-out regions 1102a, 1102b. The keep-out regions 1102a, 1102b correspond to the capacitor-free region 928 of the capacitor layer 916 of the DRAM wafer 904. Each capacitor block 1104 and keep-out region 1102a, 1102b may have dimensions of about 25 μm by 25 μm. It is appreciated that the dimensions given herein are only example dimension and any other suitable dimensions may be used. Additionally, the number of capacitor blocks 1104 in each repeatable capacitor unit 1100 may vary depending on the size of the repeatable capacitor unit 1100 and the capacitor blocks 1104.

The capacitor blocks 1104 and keep-out regions 1102a, 1102b are arranged such that they form a rectangle of 5 blocks by 3 blocks in dimensions. No capacitors are provided at the keep-out regions 1102a, 1102b. As such, the shape of the repeatable capacitor unit 1100 is a rectangle comprising an area of 15 units, but with two units in diagonally opposite corners removed. That is, the top row comprises 4 capacitor blocks 1104, the middle row comprises 5 capacitor blocks 1104, with a first end of the row aligned with the same end of the top row (the left-hand end in FIG. 11A), and the bottom row comprises 4 capacitor blocks 1104, with the second end of the middle row being aligned with the same respective end of the bottom row (the right-hand end in FIG. 11A). The length of the diagonal of the repeatable capacitor unit 1100 is equal to a bump pitch since the diagonally opposite corners comprise the keep-out regions 1102a, 1102b.

It will be appreciated that the structure shown in FIG. 11A and described above is only one possible structure of the repeatable capacitor 1100. The layout and number of capacitor blocks 1104 depends on the size of the capacitor blocks 1104 and the pitch of the C4 balls. There must be a keep-out region 1102a, 1102b at the location of the C4 ball, as discussed below, and each repeatable capacitor unit 1100 connects to two different C4 balls in diagonally opposite corners. There may, therefore, be a larger or smaller number of capacitor blocks 1104 required in order to create a repeatable capacitor unit 1100 which is able to fulfil these requirements, depending on the size of the blocks 1104 and the pitch of the C4 balls. The number of capacitor blocks 1104 comprising the repeatable capacitor unit 1100 may be between 10 and 20.

The keep-out regions 1102a, 1102b provide capacitor free areas at which the C4 bumps connect to the TSVs 918 of the DRAM wafer 904. The supply voltage $V_{DD}$ and the ground voltage $V_{SS}$ are applied at opposite corners of the repeatable capacitor block 1100. In the example of FIG. 11A, the supply voltage is applied at the top right-hand corner in a supply keep-out regions 1102a and the ground voltage is applied at the bottom left-hand corner in a ground keep-out region 1102b.

The pitch of the TSVs 918 affects the size of the keep-out regions 1102a, 1102b. A finer pitch allows these regions 1102a, 1102b to be smaller. Smaller keep-out regions 1102a, 1102b are desirable since no capacitors are present at the keep-out regions 1102a, 1102b, and so the smaller the keep-out regions 1102a, 1102b the higher the capacitance of the repeatable capacitor unit 1100 for a repeatable capacitor unit 1100 of constant dimensions.

An array of wafer-on-wafer connectors can be seen. The example of FIG. 11A shows the WoW connectors 924 to be equally spaced over the surface of the DRAM wafer 904. The WoW connectors 924 may have a pitch of the order of 2 μm. F, for example, the pitch may be in the range of 1 μm to 5 μm. It will be appreciated that other WoW connection pitches may be possible depending on the requirements of the processor wafer 902. The WoW connectors 924, shown in FIG. 9, provide connections between the DRAM wafer 904 and the processor wafer 902.

The WoW connectors 924 can be classified into two categories depending on their function: $V_{DD}$ WoW connectors connected to the supply voltage and $V_{SS}$ WoW connectors 924 connected to ground.

The supply keep-out region 1102a comprises predominantly $V_{DD}$ WoW connectors while the ground keep-out region 1102b comprises predominantly $V_{SS}$ WoW connectors. The capacitor units 1104 in line in the x-direction with the ground keep-out region 1102b comprise $V_{SS}$ WoW connectors. The capacitor blocks 1104 in line in the x-direction with the supply keep-out region 1102a comprise some $V_{DD}$ WoW connectors.

There may be some WoW connectors 924 which are not either $V_{SS}$ or $V_{DD}$ connectors. There may be no connection between these connectors and the processor wafer 902. For example, the WoW connectors 924 which are not aligned with either the $V_{SS}$ or $V_{DD}$ C4 ball, i.e. along the middle row of capacitor blocks 1104.

FIG. 11B shows a capacitor layer comprising multiple repeatable capacitor units 1100. The repeatable capacitor units 1100 are aligned such that rows of $V_{DD}$ WoW connectors and $V_{SS}$ WoW connectors are created.

The keep-out regions 1102a, 1102b are aligned such that a group of four keep-out regions 1102a, 1102b of the same type are grouped together. Each group of four keep-out regions 1102a, 1102b is associated with a single C4 ball 920.

The repeatable capacitor units 1100 may be replicated roughly 75000 times per die. It will be appreciated that the number of repeatable capacitor units 1100 per die will depend on the dimensions of both the die and the repeatable capacitor units 1100.

There are a number of advantages to the structure shown in FIG. 9 when using the DRAM wafer 904 as a capacitor layer.

Firstly, the processor wafer 902 does not need to be altered in any way Thinning of the logic layer would require either careful thinning to avoid the logic or a redesign of the logic to allow for thinning. The TSVs 918 may be formed in the DRAM wafer to permit connections to the logic wafer. There is no need to redesign the processing circuitry within the processing die. Thus, by using the DRAM wafer as the top layer, no costly and time consuming redesign of the logic wafer is required, such that the same logic wafer can be used both with and without the WoW capacitor wafer, made with the same mask set for most layers.

However, in alternative embodiments, the two wafers 902, 904 could be switched. That is, the bottom wafer shown in FIG. 9 is the DRAM wafer 904, and the top wafer the processor wafer 902. The processor wafer 902 would be thinned and TSVs 918 created through the substrate 906 of the processor wafer 902. In such an embodiment, the DRAM wafer 904 would still provide on-die capacitance. However, the keep-out regions 1102a, 1102b would need to be created on the processor wafer 902. This would require a re-design of the logic on of the processor wafer 902. Additionally, the area available for logic would be reduced. The area of the processor wafer is often constrained, so it is preferable to not have keep-out regions in the processor wafer 902. The area of silicon in the DRAM wafer 904 is less precious than that in the processor wafer 904.

Figure 12:
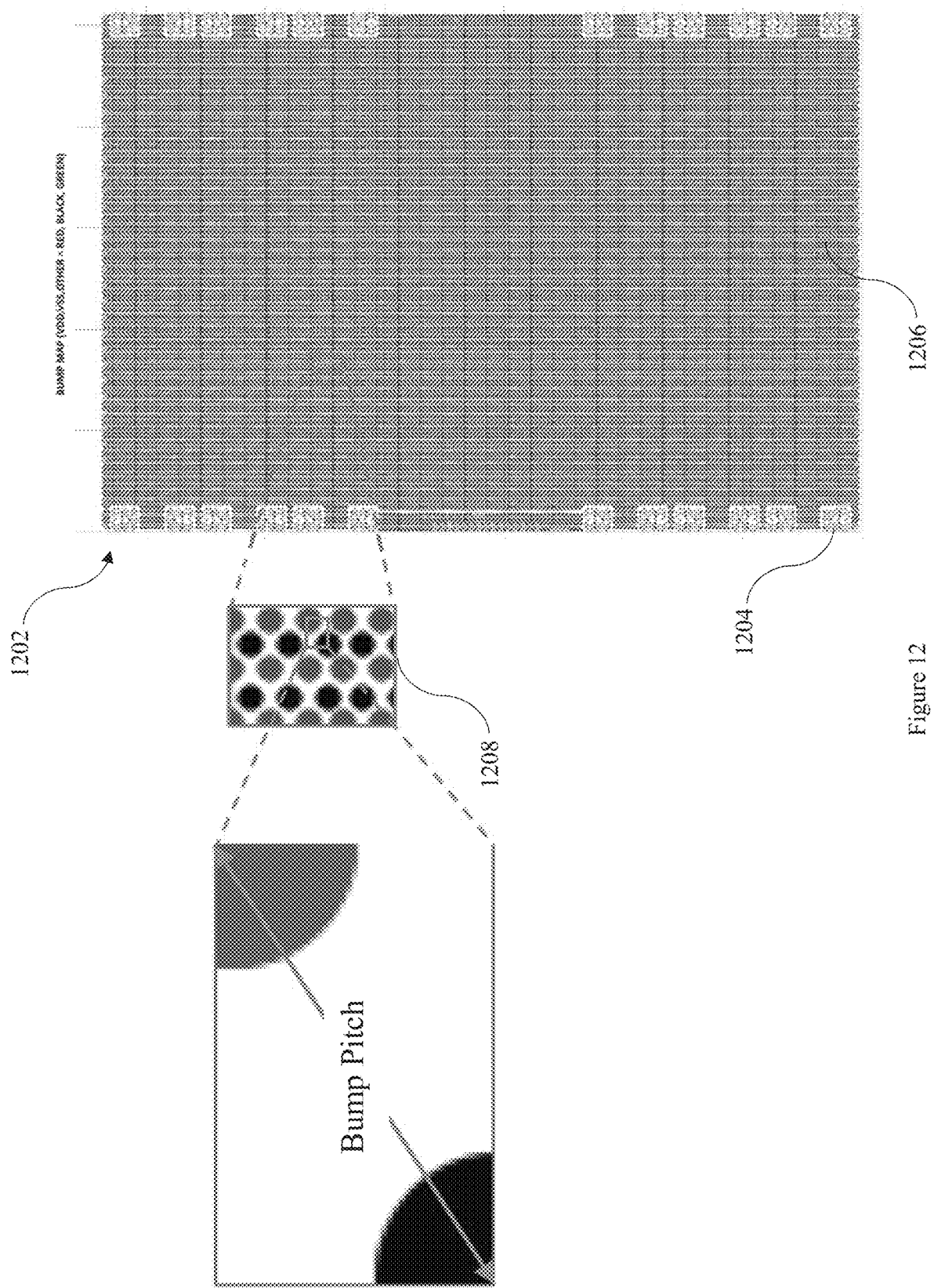
FIG. 12 shows an example C4 bump map.

FIG. 12 shows an example C4 bump map 1202 used in some embodiments. The dimensions of the bump map 1202 correspond to the size of the dies, here 25.7 mm by 32 mm. It will be appreciated that other dies of different dimensions may be used in some embodiments.

The bump map 1202 shows each bump as a discrete dot. Three different coloured dots are shown. Red dots represent $V_{DD}$ bumps, black dots represent $V_{SS}$ bumps, and green dots represent "other" bumps. Other bumps may be used for I/O ports for example.

The other bumps are clustered together in patches 1204 which are positioned around the outside of the processor die. A small number of $V_{SS}$ bumps are situated in the patches 1204. The main body 1206 of the die comprises columns of $V_{DD}$ and $V_{SS}$ bumps, as shown more clearly in an expanded view 1208. The centres of the bumps of the processor die are separated by the bump pitch, as shown in FIG. 12. The bump pitch may be roughly 150 µm, although it will be appreciated that other dimensions may be used. The bump pitch may be in the range of 25 µm to 250 µm.

The repeatable capacitors 1100 cover only the $V_{DD}$-$V_{SS}$ bump pattern area, that is they only cover the main body 1206 of the die and not the patches 1204. There are no repeatable capacitors over, for example, the I/O ports. For example, there may be about 75000 repeatable capacitor units 1100 covering the main body 1206 of the die.

Figure 7:
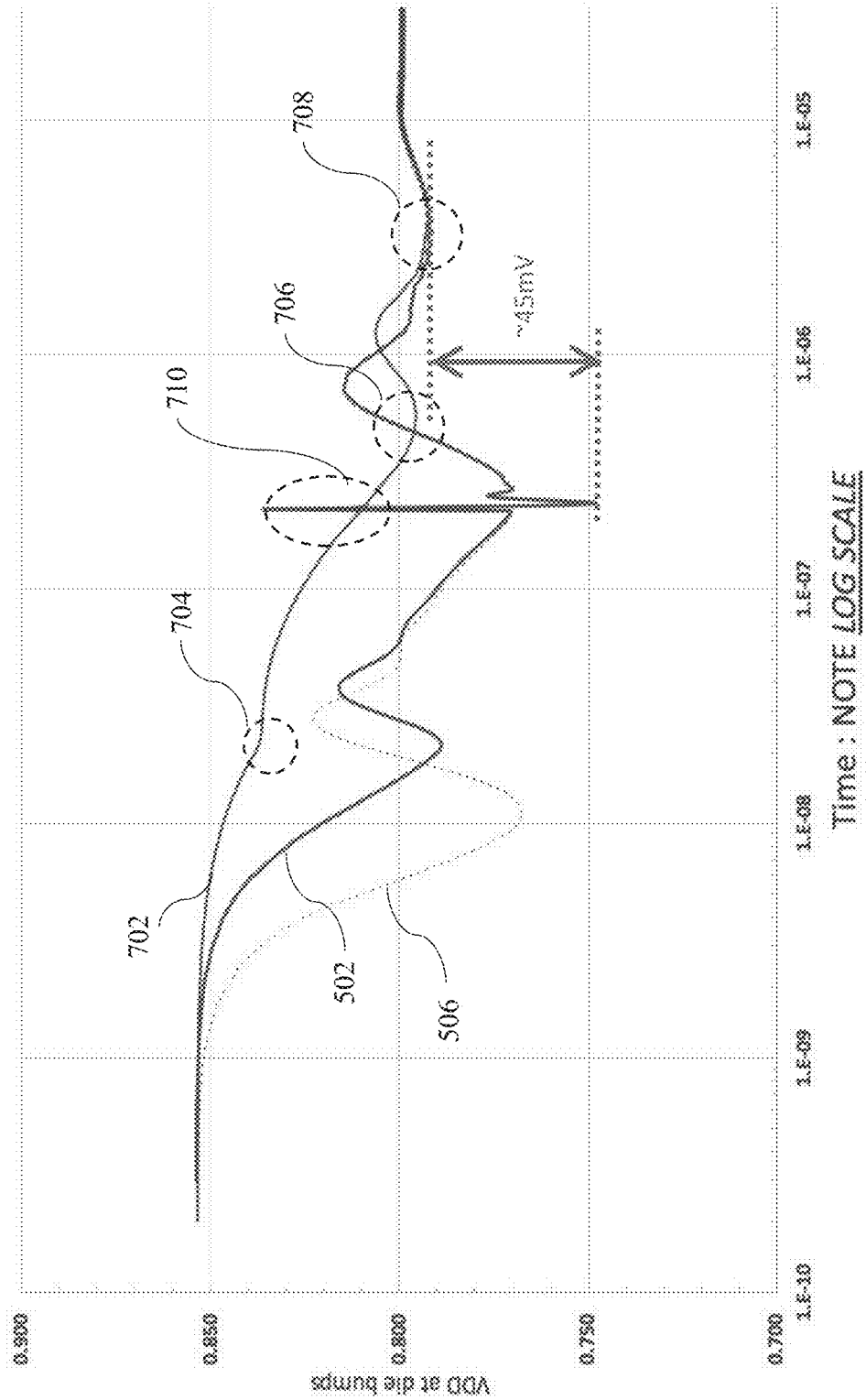
FIGS. 7 and 8 show a load step response simulation of a chip with a WoW capacitor.

FIG. 7 shows the load step response of the Colossus Mk1 with a 750 µF on-chip capacitor. The improved load step response 702 is shown superimposed on the 20 ns step response 502. The 5 ns step response 506 is also shown.

As with the 20 ns step response 502 discussed with reference to FIG. 5, the improved step response 702 has three supply voltage minima.

The first supply voltage minima 704 is a result of the distributed on-chip capacitor discharging. The on-chip capacitance includes both the on-chip capacitance inherent in the chip as illustrated in FIGS. 2 and 13 and the DRAM wafer 904 capacitance. The minimum value seen for this undershoot is around 0.835V and occurs at approximately 10 ns after the load step is applied. It can be seen that the minimum supply voltage value is much greater than that of plot 502 with no DRAM wafer 904 capacitor. This is because the capacitance associated with each clock switch is a much lower percentage of the total on-chip capacitance, so the supply voltage drop for the same number of clock switches is of much smaller magnitude.

The second supply voltage undershoot 706 is a result of the on-chip capacitance and the package capacitance discharging. This undershoot 706 has a minimum value of around 0.795 V. The minimum supply voltage at the undershoot is sensitive to the on-chip capacitance, the package capacitance and the series impedance of the PCB.

The third undershoot 708 is due to the PCB capacitor discharging. The minimum voltage value is sensitive to the PCB capacitance and the supply control loop response as before.

There is still a spike 710 in the supply voltage caused by the clock switching. However, this spike 710 only increases the supply voltage and the magnitude of the spike 710 is greatly reduced in comparison to the spike 602 of the response of the IPU with no distributed on-chip capacitor.

It can be seen from the graphs in FIG. 7 that by introducing the distributed on-chip capacitor the minimum voltage has increased by about 45 mV. The minimum voltage in the improved load step response 702 occurs as a result of the discharging PCB capacitor and has a value of around 0.795V. The difference between the initial voltage and the minimum voltage has been reduced to around 0.06V from over 0.1V with no on-chip capacitor. The decreased difference in supply voltage means that the initial voltage can be lowered to around 0.81V, down from 0.855V, while still maintaining the same minimum supply voltage.

Figure 8:
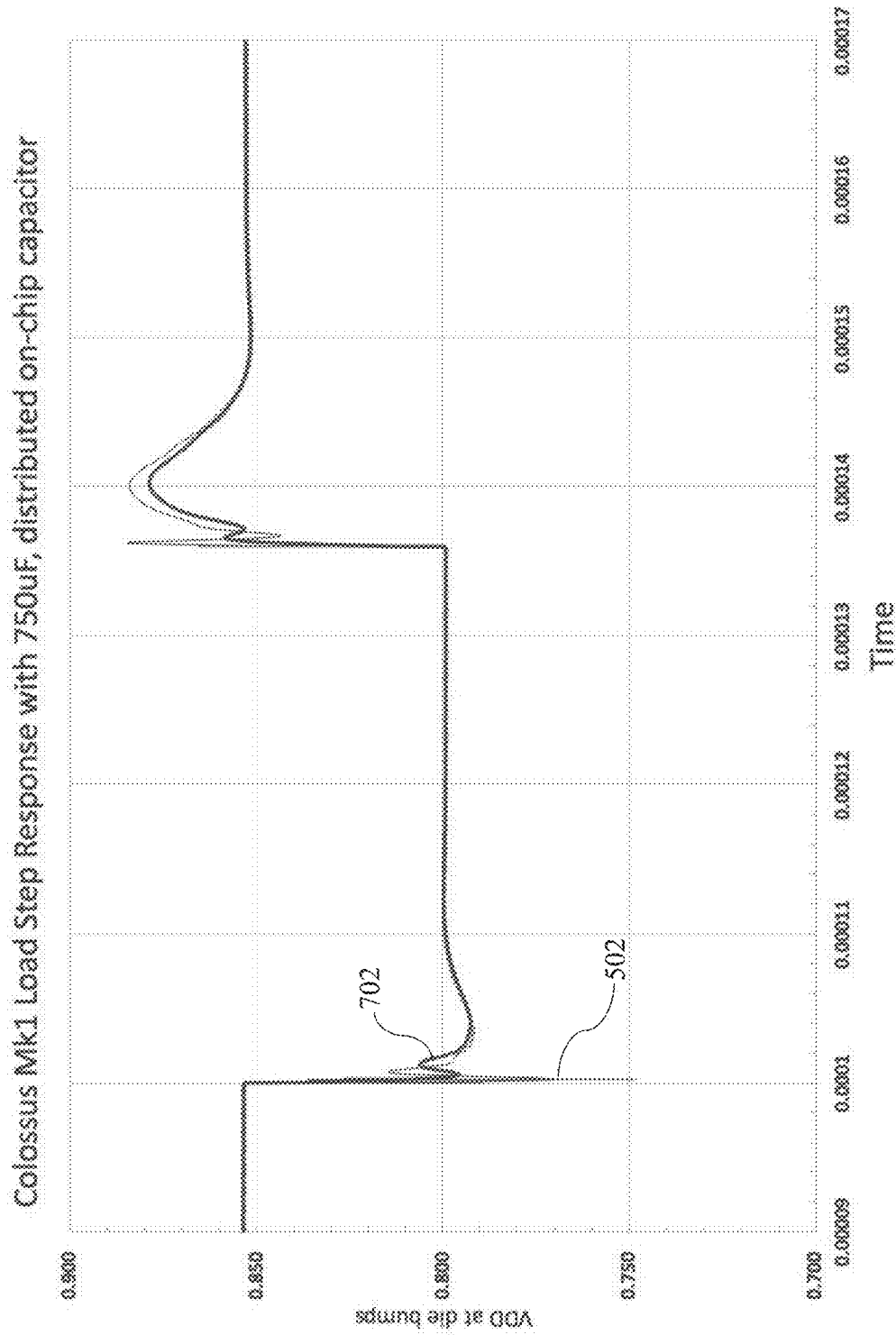

FIG. 8 shows the improved load step response 702 and the 20 ns step response 502 over a longer period of time, which includes a load step increase, as in FIG. 4. The significant improvement in undershoot can be seen. However, there is little improvement to the overshoot experienced at the load step increase. While the maximum supply voltage is relevant to power consumption, the overshoot has much less effect on the performance of the IPU than the undershoot as it does not affect the initial supply voltage and there is no requirement on the maximum voltage to ensure the hardware performs operations without faults.

Figure 14:
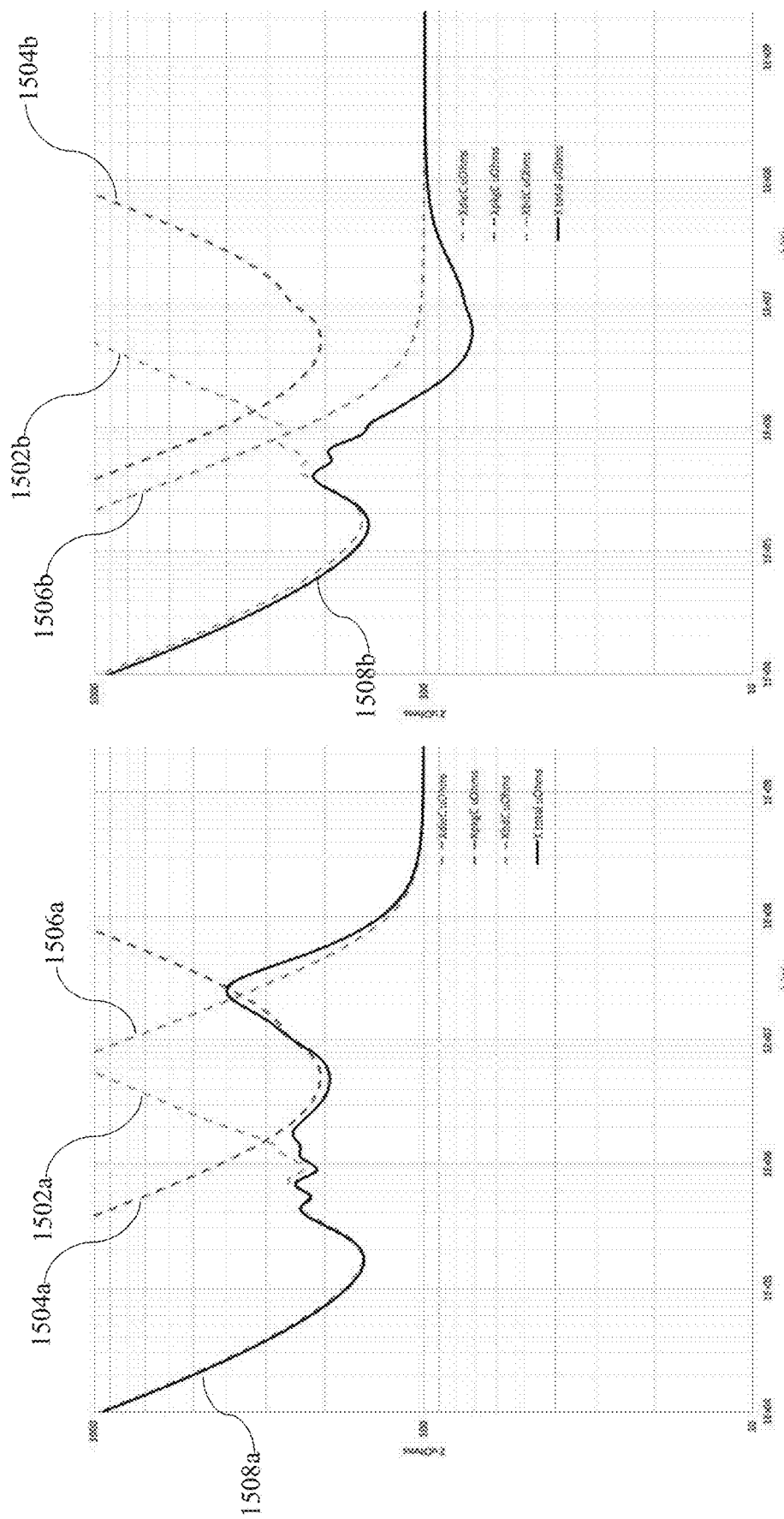
FIG. 14 shows the supply impedance seen at the bumps of a chip without and with a WoW capacitor.

FIG. 14 shows the supply impedance seen at the bumps of a Colossus Mk2 die. The left-hand graph shows the supply impedance when there is no WoW capacitor and the right-hand graph shows the supply impedance when a WoW capacitor has been introduced. The graphs are plots of impedance in µOhms against frequency in Hz.

The graphs each show four different plots. Plots 1502a and 1502b show the effect of frequency on the impedance of the capacitors mounted on the printed circuit board (bd), which include the bilk capacitors with a minimum impedance at around 180 kHz and other, smaller capacitors with minimum impedances up to 1 MHz. Plots 1504a and 1504b show the effect of frequency on the impedance of the package. Plots 1506a and 1506b show the effect of frequency on the on-die impedance. Plots 1508a and show the overall effect of frequency on the supply impedance. The overall effect is the superposition of effect due to the three components shown on the graphs.

While the impedance response to varying frequency of the capacitors mounted on the printed circuit board and the package are similar in both the case of with and without the WoW capacitor, the on-die impedance drops at much lower frequency in the presence of the WoW capacitor. This has the effect of reducing the overall impedance to the minimum at a lower frequency, as can be seen by comparing the overall impedance plots 1508a, 1508b. The WoW capacitor also has the effect of lowering the minimum overall impedance. This minimum occurs at a frequency of approximately $6e^7$ Hz.

An additional benefit of the WoW capacitor is that the need for the discrete on-chip capacitors 1808 is reduced as the WoW capacitor provides on-chip capacitance. Therefore, the number of discrete capacitors 1808 can be reduced, or the need for discrete capacitors 1808 may be removed completely such that no discrete capacitors 1808 are required. In such an embodiment, the WoW capacitor would provide the whole first level of capacitance.

Some embodiments use wafer-on-wafer technology. Wafer-on-wafer (WoW) technology is a relatively recent development in die manufacture. Currently, it is used to manufacture GPUs so that they can become more powerful without increasing their physical size. Layers are stacked vertically rather than horizontally along the printed circuit board (PCB).

Rather than the traditional interconnects used in multi-chip modules (MCMs), WoW uses through silicon vias (TSVs) to allow the stacked dies to communicate. This improves power efficiency and decreases latency lost between modules. In order to provide a way of transmitting signals to/from the wafers, that is in order to access a back end of line (BeOL) layer of the wafers, TSVs are manufactured through one of the wafers for the I/Os. Since the wafers are mirror images, TSVs through one wafer allow supply voltage to pass to both wafers. This provides a direct connection between the logic and the array of C4 balls.

The logic layer is thinned so as to reduce the thickness of the chip. This can be done as, once the front end of line (FeOL) and BeOL layer have been formed on the silicon layer of the wafer, the silicon layer provides no further function. The logic wafer may be thinned to only a few microns in thickness.

The resulting stacked wafers can then be bumped, singulated, and packaged conventionally (flip-chip BGA), as known in the art.

It will be appreciated that the above embodiments have been described by way of example only. Other variants or use cases of the disclosed techniques may become apparent to the person skilled in the art once given the disclosure herein. The scope of the disclosure is not limited by the described embodiments but only by the accompanying claims.

The invention claimed is:

1. A computer structure comprising:
a first silicon substrate in which is formed computer circuitry configured to perform computing operations, the first substrate having a self-supporting depth and an inner facing surface;
a second silicon substrate in which is formed a plurality of distributed capacitance units, the second substrate having an inner facing surface located in overlap with the inner facing surface of the first substrate and connected to the first substrate via a set of connectors arranged extending depthwise of the structure between the inner facing surfaces, the inner facing surface of the second silicon substrate having planar surface dimensions matching the planar surface dimensions of the inner facing surface of the first silicon substrate;
the second substrate having an outer facing surface on which are arranged a plurality of connector terminals for connecting the computer structure to a supply voltage, wherein the second substrate has a smaller depth than the first substrate.

2. The computer structure according to claim 1, wherein the inner facing surfaces of the first and second substrates are bonded by one or more bonding layer.

3. The computer structure according to claim 1, wherein connectors comprise through silicon vias which extend through the second silicon substrate to the first silicon substrate to provide an electrical connection between the connector terminals and the first silicon substrate.

4. The computer structure according to claim 3, wherein each distributed capacitor unit comprises a plurality of capacitor blocks each having a capacitance in the range of 0.1 to 1.5 nF, wherein each distributed capacitance unit comprises two keep-out regions, the keep-out regions being at locations of respective connector terminals, the keep-out regions and capacitor blocks being of equal size, and wherein the through silicon vias are provided at the keep-out regions of the distributed capacitor units.

5. The computer structure according to claim 1, wherein each distributed capacitor unit comprises a plurality of capacitor blocks each having a capacitance in the range of 0.1 to 1.5 nF.

6. The computer structure according to claim 5, wherein each distributed capacitor unit has between 10 and 20 capacitor blocks.

7. The computer structure according to claim 5, wherein each distributed capacitance unit has a capacitance in a range of 5 to 30 nF.

8. The computer structure according to claim 5, wherein each distributed capacitance unit comprises two keep-out regions, the keep-out regions being at locations of respective connector terminals, the keep-out regions and capacitor blocks being of equal size.

9. The computer structure according to claim 5, wherein each capacitor block comprises trench capacitors arranged in a hexagonal array, wherein each trench capacitor has six neighbouring trench capacitors, each trench capacitor located equidistant from each of its neighbouring trench capacitors.

10. The computer structure according to claim 1, wherein a total planar area of distributed capacitance units is at least 80% of a total planar area of the first silicon substrate, a capacitance of the plurality of distributed capacitance units being in the range of 0.5 $\mu F/mm^2$ to 3 $\mu F/mm^2$.

11. The computer structure according to claim 1, wherein the first silicon substrate has a depth of 400 $\mu m$ to 1000 $\mu m$.

12. The computer structure according to claim 1, wherein the second silicon substrate has a non-self-supporting depth, the depth being less than 10 $\mu m$.

13. The computer structure according to claim 1, wherein the distributed capacitance units are arranged in a regular array, each distributed capacitance unit being connected to a supply voltage connector terminal and a ground connector terminal.

14. The computer structure according to claim 13, wherein each connector terminal is connected to four different distributed capacitor terminals.

15. The computer structure according to claim 1, wherein the set of connectors provides connections between the first and second silicon substrates at the locations of the connector terminals.

16. The computer structure according to claim 1, wherein the computer circuitry comprises a plurality of processing units each having an execution unit and a local memory, the plurality of processing units configured to compute in parallel.

17. The computer structure according to claim 16, wherein the computer circuitry comprises synchronisation circuitry configured to control the plurality of processing units to operate according to a bulk synchronous parallel protocol.

18. The computer structure according to claim 16, wherein the computer circuitry comprises a clock connected to control operations of the processing units.

19. A semiconductor die comprising:
a first semiconductor substrate in which is formed computer circuitry configured to perform computing operations, the first semiconductor substrate having a self-supporting depth and an inner facing surface;
a second semiconductor substrate in which is formed a plurality of distributed capacitance units, the second semiconductor substrate having an inner facing surface located in overlap with the inner facing surface of the first semiconductor substrate and connected to the first semiconductor substrate via a set of connectors arranged extending depthwise of the semiconductor die between the inner facing surfaces;
the second semiconductor substrate having an outer facing surface on which are arranged a plurality of connector terminals for connecting the semiconductor die to a supply voltage, wherein the second semiconductor substrate has a smaller depth than the first semiconductor substrate.

20. The semiconductor die of claim 19, further comprising a bonding layer between the inner facing surface of the first semiconductor substrate and the inner facing surface of the second semiconductor substrate.

21. The semiconductor die of claim 19, wherein connectors comprise through silicon vias which extend through the second silicon substrate to the first silicon substrate.

22. The semiconductor die of claim 19, wherein the first silicon substrate has a depth of 400 μm to 1000 μm.

23. The semiconductor die of claim 19, wherein the second silicon substrate has a non-self-supporting depth less than 10 μm.

24. The semiconductor die of claim 19, wherein each distributed capacitance unit comprises two keep-out regions.

25. The semiconductor die of claim 19, further comprising a processing unit having an execution unit and a local memory.

* * * * *